(12) United States Patent
Nakamura et al.

(10) Patent No.: US 8,338,927 B2
(45) Date of Patent: Dec. 25, 2012

(54) SEMICONDUCTOR DEVICE WITH THE LEADS PROJECTED FROM SEALING BODY

(75) Inventors: Hiroyuki Nakamura, Tokyo (JP);
Atsushi Nishikizawa, Tokyo (JP);
Nobuya Koike, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/225,788

(22) Filed: Sep. 6, 2011

(65) Prior Publication Data

US 2011/0316137 A1   Dec. 29, 2011

Related U.S. Application Data

(63) Continuation of application No. 12/432,075, filed on Apr. 29, 2009, now Pat. No. 8,026,130.

(30) Foreign Application Priority Data

Jun. 24, 2008   (JP) .................................. 2008-164388

(51) Int. Cl.
*H01L 21/44* (2006.01)
(52) U.S. Cl. ................. 257/676; 257/E23.052; 438/123
(58) Field of Classification Search .................. 257/676, 257/E23.052; 438/123, 124
See application file for complete search history.

(56) References Cited

U.S. PATENT DOCUMENTS

| | | | |
|---|---|---|---|
| 5,661,086 A | 8/1997 | Nakashima et al. | |
| 6,281,568 B1 | 8/2001 | Glenn et al. | |
| 6,984,877 B2 | 1/2006 | Lee et al. | |
| 7,122,884 B2 | 10/2006 | Cabahug et al. | |
| 7,804,159 B2 * | 9/2010 | Shimanuki ..................... | 257/666 |
| 2002/0130400 A1 * | 9/2002 | Jeong et al. ..................... | 257/670 |
| 2003/0228720 A1 | 12/2003 | Ito et al. | |
| 2008/0105959 A1 * | 5/2008 | Tanaka .......................... | 257/676 |

FOREIGN PATENT DOCUMENTS

| | | |
|---|---|---|
| JP | 5-315381 A | 11/1993 |
| JP | 7-142664 | 6/1995 |
| JP | 2000-299400 A | 10/2000 |
| JP | 2001-93921 | 4/2001 |
| JP | 2001-102510 A | 4/2001 |
| JP | 2007-214237 A | 8/2007 |

OTHER PUBLICATIONS

JP Office Action in JP Application No. 2008-164388 dated Jun. 28, 2012.

* cited by examiner

*Primary Examiner* — Phuc Dang
(74) *Attorney, Agent, or Firm* — Mattingly & Malur, PC

(57) ABSTRACT

The semiconductor device includes a semiconductor chip, a chip mounting portion, a suspension lead, and a plurality of leads. Each of the plurality of leads has a first part and a second part, and the suspension lead has a first part and a second part. The first part of each of the plurality of leads and the suspension lead project from the plurality of side surfaces of the sealing body, respectively. Parts of the side surfaces of the plurality of leads and the suspension lead are exposed from the plurality of side surfaces of the sealing body, respectively. An area of the obverse surface of the first part of the suspension lead is larger than an area of the obverse surface of the first part of each of the plurality of leads in a plan view.

20 Claims, 27 Drawing Sheets

SEMICONDUCTOR DEVICE WITH THE LEADS PROJECTED FROM SEALING BODY

CROSS-REFERENCE TO RELATED APPLICATIONS

This application is a continuation application of U.S. Ser. No. 12/432,075, filed Apr. 29, 2009 (now U.S. Pat. No. 8,026,130), the entire disclosure of which is incorporated herein by reference.

This application claims priority to Japanese Patent Application No. 2008-164388 filed on Jun. 24, 2008, the entirety of which is incorporated herein by reference.

BACKGROUND OF THE INVENTION

The present invention relates to a technique effective in its application to a packaging technique in a method for manufacturing a semiconductor integrated circuit device (or a semiconductor device).

In Japanese Unexamined Patent Publication No. 2007-214237 (Patent Literature 1) there is disclosed a technique wherein, in a packaging process for a resin-sealed package with less external leads like, for example, a discrete transistor, resin burrs on the leads are removed by a simple burr discriminating method using a laser and a water jet, followed by solder plating.

In Japanese Unexamined Patent Publication No. 2001-102510 (Patent Literature 2) there is disclosed a technique wherein, in a packaging process for a resin-sealed package such as an IC package, tie bars are cut after resin sealing and resin burrs remaining between leads are removed using a $CO_2$ laser, followed by solder plating.

In Japanese Unexamined Patent Publication No. 2000-299400 (Patent Literature 3) there is disclosed a technique wherein, in connection with a non-leaded flat package, a sealing material present between leads is removed by a punching die and exposed leads are covered with metal coating by plating for enhancing the solder adherability, in order to prevent a short-circuit between leads at the time of packaging.

[Patent Literature 1]
Japanese Unexamined Patent Publication No. 2007-214237

[Patent Literature 2]
Japanese Unexamined Patent Publication No. 2001-102510

[Patent Literature 3]
Japanese Unexamined Patent Publication No. 2000-299400

SUMMARY OF THE INVENTION

It has turned out that the following problems are encountered in the packaging of a QFN (Quad Flat Non-Leaded Package) type plastic package (see FIG. 28) for which a high reliability such as the vehicle onboard reliability is required. Since side faces of leads 4 are almost covered with lead-to-lead resin projecting portions 54, solder fillet is not formed in a satisfactory manner in reflow packaging. An attempt to remove the lead-to-lead resin projecting portions 54 mechanically by a punching die encounters a problem related to the precision of the punching die and is very likely to induce cracking of the package body or terminal deformation. If the punching die and the package body are spaced away from each other to such an extent as to avoid the above problem, the problem of remaining resin arises, thus making it impossible to completely remove the lead-to-lead resin projecting portions 54. As a result, the side faces of the leads cannot be exposed sufficiently and hence a surface treatment for improving the spread of solder in packaging, e.g., in solder plating, cannot be applied to a satisfactory extent.

The present invention has been accomplished for solving the above-mentioned problems.

It is an object of the present invention to provide a method for manufacturing a highly reliable semiconductor integrated circuit device.

The above and other objects and novel features of the present invention will become apparent from the following description and the accompanying drawings.

The present invention is typically outlined below.

According to the present invention there is provided a method for manufacturing a QFN type plastic-sealed semiconductor integrated circuit device using a multi-lead frame having a tie bar for tying external end portions of plural leads, wherein sealing resin filled between an outer periphery of a mold cavity and the tie bar is removed with use of a laser and thereafter a surface treatment is performed to improve the spread of solder in packaging, e.g., in solder plating.

The following is a brief description of an effect obtained by the typical invention as disclosed herein.

By removing, with a laser, sealing resin filled between an outer periphery of a mold cavity and a tie bar and thereafter performing a surface treatment for improving the spread of solder in packaging, e.g., in solder plating, in a method for manufacturing a QFN type plastic-sealed semiconductor integrated circuit device using a multi-device lead frame having a tie bar for tying external end portions of plural leads, there is formed a sufficient solder layer on side faces of each lead and hence it is possible to improve the reliability of solder reflow packaging.

DETAILED DESCRIPTION OF THE PREFERRED EMBODIMENTS

[Outline of Typical Modes]

Figure 1:
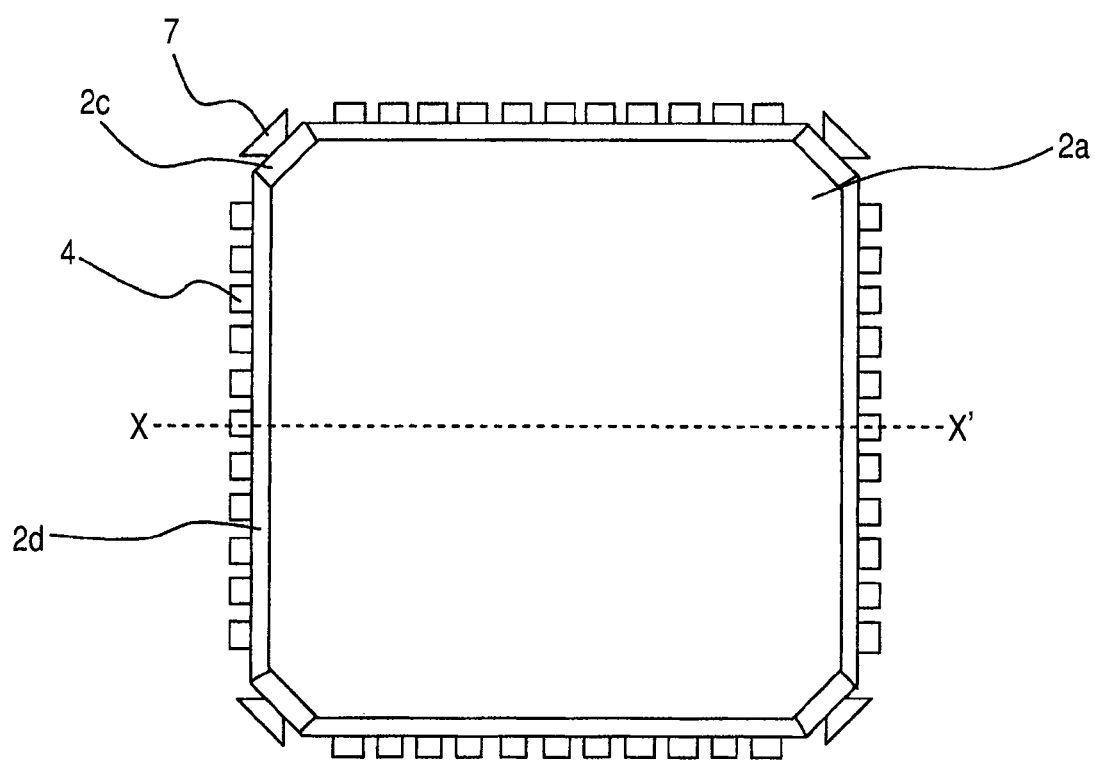
FIG. 1 is a package top view showing an example of a QFN type package structure of a semiconductor integrated circuit device manufactured by a semiconductor integrated circuit device manufacturing method according to an embodiment of the present invention.

First, typical modes of the present invention as disclosed herein will be outlined below.

1. A method for manufacturing a semiconductor integrated circuit device, comprising the steps of: (a) setting to a molding die a lead frame having a plurality of unit device regions and with a semiconductor chip being fixed in each of the unit device regions, and sealing the semiconductor chip with sealing resin to form a resin sealing body in each of the unit device regions, each of the unit device regions comprising (i) a generally quadrangular die pad with the semiconductor chip fixed thereto, (ii) a plurality of leads extending from the exterior of each side of the die pad so as to form a plane almost flush with a bottom of the resin sealing body and projecting from each of the side faces of the resin sealing body, (iii) a tie bar for coupling the vicinities of outer end portions of the leads, and (iv) lead-to-lead resin projecting portions each filling between adjacent ones of the leads and projecting from the side faces of the resin sealing body; (b), after the step (a), radiating laser light to the lead-to-lead resin projecting portions in each of the unit device regions to remove the lead-to-lead resin projecting portions; (c), after the step (b), forming solder layers over exposed surfaces respectively of the leads in each of the unit device regions; and (d), after the step (c), cutting the external end portions of the leads in each of the unit device regions, thereby separating the leads and the tie-bar from each other and cutting and separating the resin sealing body from the lead frame.

2. A method according to the above 1, wherein, in the step (b), the laser light is radiated also to the leads to remove resin burrs formed over the leads.

3. A method according to the above 1 or 2, further comprising the step of (e), after the step (b) and before the step (c), performing electrolysis for surfaces of the leads in an aqueous solution using the leads as cathodes.

4. A method according to the above 3, further comprising the step of, after the step (e) and before the step (c), performing a water jet treatment for the surfaces of the leads.

5. A method according to any of the above 1 to 4, wherein the sealing in the step (a) is performed by transfer molding.

6. A method according to any of the above 1 to 5, wherein the laser light is near infrared light.

7. A method according to any of the above 1 to 6, wherein the laser light is emitted from a YAG laser.

8. A method according to any of the above 1 to 7, wherein the wavelength of the laser light is 1064 nm.

9. A method according to any of the above 1 to 8, wherein the total number of the leads projecting from the resin sealing body in each of the unit device regions is in the range of 20 to 150.
10. A method according to any of the above 1 to 8, wherein the total number of the leads projecting from the resin sealing body in each of the unit device regions is in the range of 40 to 150.
11. A method according to any of the above 1 to 8, wherein the total number of the leads projecting from the resin sealing body in each of the unit device regions is in the range of 50 to 150.
12. A method according to any of the above 1 to 11, wherein the length of projection of each of the leads is in the range of 0.1 to 0.5 mm.
13. A method according to any of the above 1 to 11, wherein the length of projection of each of the leads is in the range of 0.2 to 0.4 mm.
14. A method according to any of the above 1 to 13, wherein the pitch of the leads is in the range of 0.2 to 0.8 mm.
15. A method according to any of the above 1 to 14, wherein the thickness of the resin sealing body is in the range of 0.3 to 1.2 mm.
16. A method according to any of the above 1 to 15, wherein the width of the resin sealing body is in the range of 3 to 10 mm.
17. A method according to any of the above 1 to 16, wherein the material of a main portion of the lead frame contains copper as a principal component.
18. A method according to any of the above 1 to 17, wherein the lead frame has a thick portion of 0.1 to 0.3 mm in thickness.
19. A method according to any of the above 1 to 18, wherein the solder layers are free of lead.
20. A method according to any of the above 1 to 19, wherein the sealing resin is free of halogen.

[Description Style, Basic Terms and How to Use]

1. An embodiment of the present invention may be described divided into plural sections where required for the sake of convenience, but unless otherwise mentioned, it is to be understood that the divided sections are not independent of each other, but configure portions of a single example, or one is a partial detail of the other or is a modification of part or the whole of the other. As to similar portions, repetition thereof is omitted in principle. Constituent elements in an embodiment are not essential unless otherwise mentioned and except in the case where they are limited theoretically to specified numbers thereof, and, further, except in the case where they are clearly essential contextually.

2. Likewise, in the description of an embodiment or the like, as to "X comprising A" or the like with respect to material and composition, selection of any other element than A as one of the principal constituent elements is not excluded unless otherwise mentioned and except in the case where an opposite answer is evident contextually. For example, by the above description is meant "X including A as a principal component" when viewed from the standpoint of the component. For example, "silicon member" is not limited to pure silicon, but it goes without saying that the silicon member in question covers SiGe alloy, other multi-element alloys containing silicon as a principal component, as well as those containing silicon and other additives.

Further, as to "copper," "gold," "epoxy resin" and "tin," no limitation is made to respective pure materials unless otherwise mentioned and except in the case where it is evident that limitation is made thereto. By those materials are meant materials containing them as principal constituent elements.

3. Likewise, although suitable examples will be shown as to figure, position and attribute, it goes without saying that no strict limitation is made to those examples unless otherwise mentioned and except in the case where it is evident contextually that limitation is made thereto.

4. When reference is made to a specific numerical value or quantity, a numeral value larger or smaller than the specific numerical value will also do unless otherwise mentioned and except in that case where limitation is made to the specific numerical value theoretically, further, except in the case where a negative answer is evident contextually.

5. By the term "wafer" is usually meant a single crystal silicon wafer with semiconductor integrated circuit devices (also true of semiconductor devices and electronic devices) formed thereon. But it goes without saying that the "wafer" in question covers an epitaxial wafer and composite wafers, e.g., a combination of an insulating substrate such as SOI substrate or LCD glass substrate and a semiconductor layer. Individual semiconductor devices divided from the wafer are designated "semiconductor chips" or merely "chips." In the present invention, a semiconductor as a substrate mainly indicates a silicon-based semiconductor, but may be a GaAs semiconductor or any other compound semiconductor.

6. As to the definition of the QFN type plastic package as referred to herein, it will be described concretely in a detailed section 1 in the following embodiment.

[Details of an Embodiment]

An embodiment of the present invention will be described below in more detail. In the accompanying drawings, the same or similar portions are identified by the same or similar symbols or reference numerals, and explanations thereof will not be repeated in principle.

Figure 2:
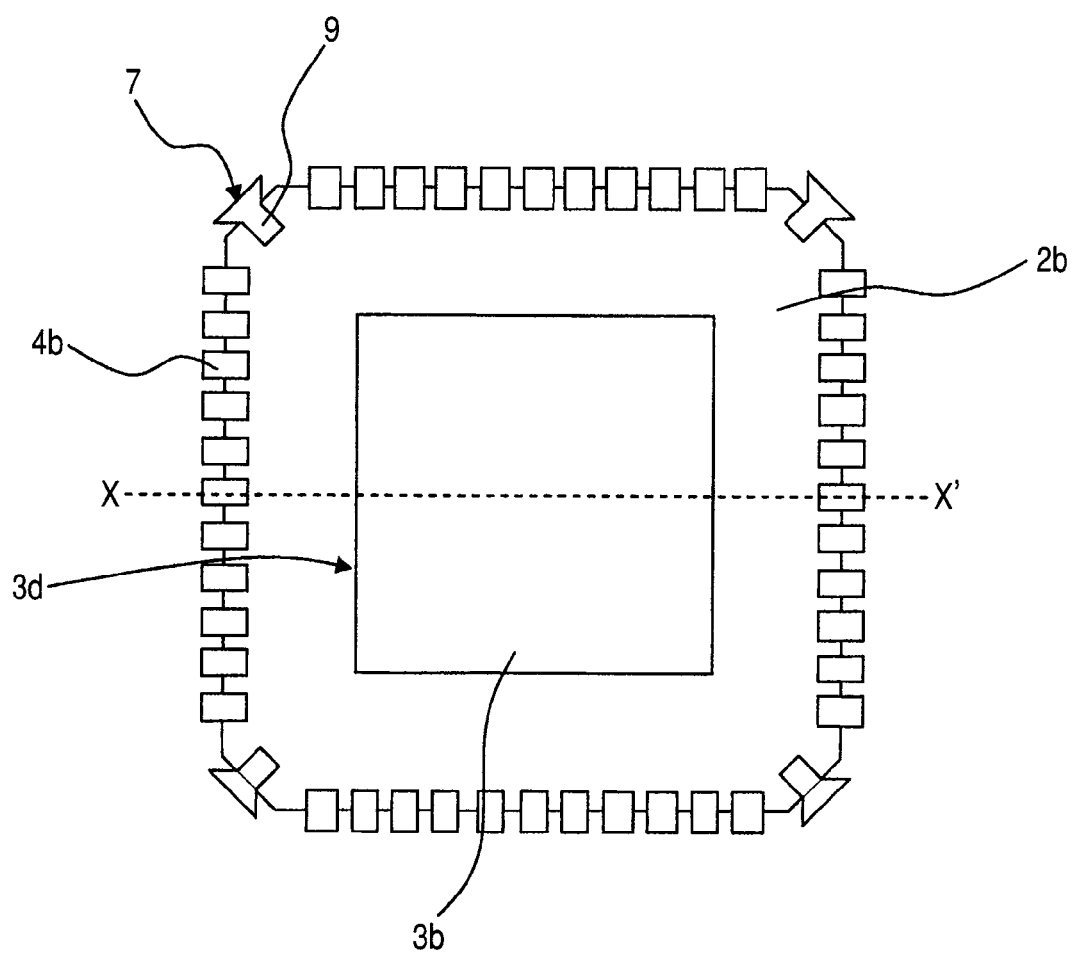
FIG. 2 is a package bottom view showing an example of the package structure of the semiconductor integrated circuit device manufactured by the semiconductor integrated circuit device manufacturing method according to the embodiment of the present invention.
Figure 3:
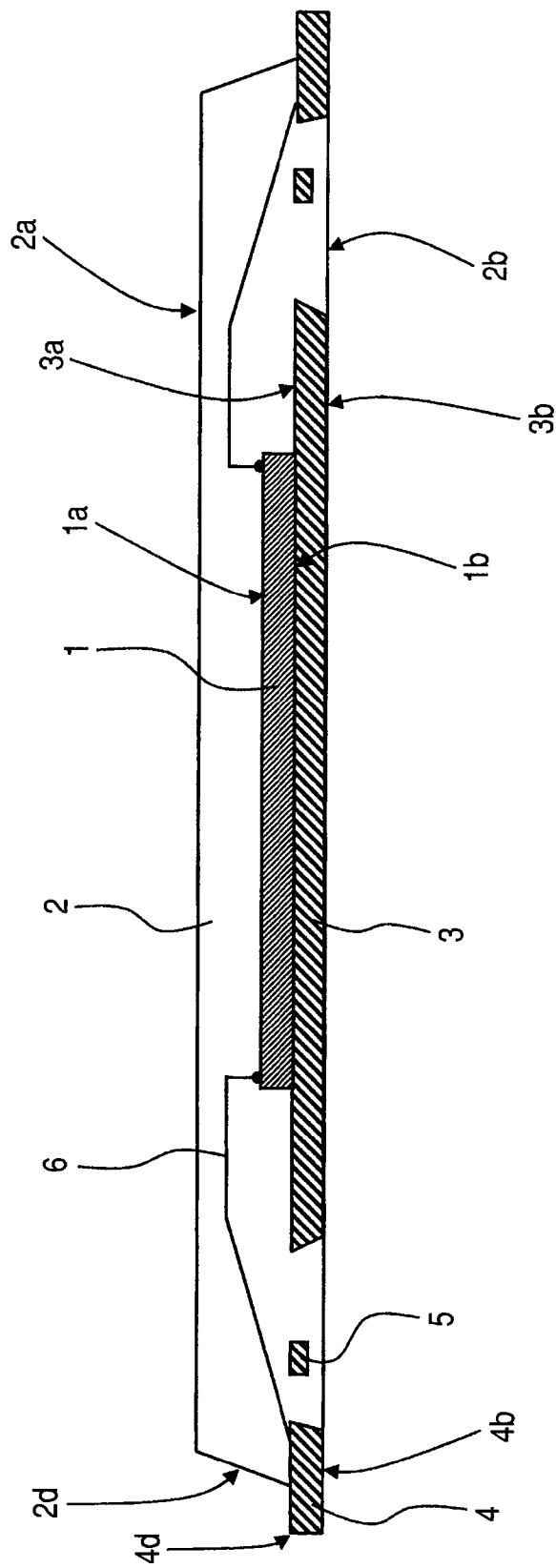
FIG. 3 is a package sectional view corresponding to the section X-X' in FIGS. 1 and 2.
Figure 28:
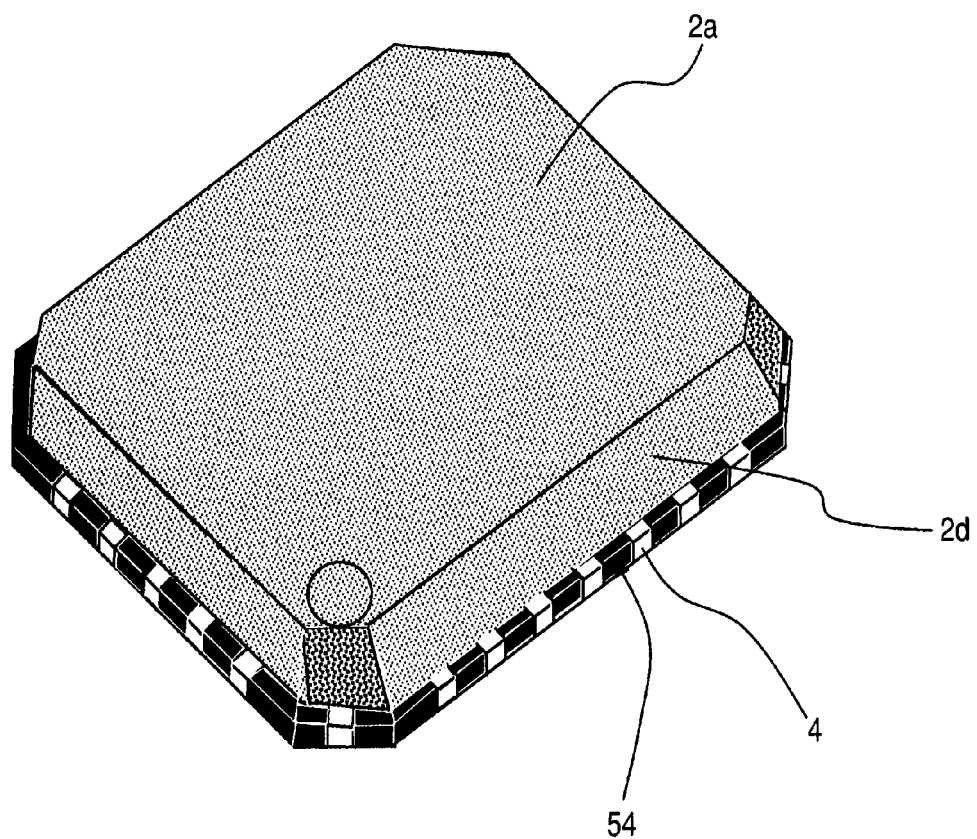
FIG. 28 is an entire perspective view of a package for explaining problems involved in a conventional QFN type package structure.

1. Explanation of a package structure, etc. of a semiconductor integrated circuit device manufactured by a semiconductor integrated circuit device manufacturing method according to an embodiment of the present invention (mainly FIGS. 1 to 3 and 28):

FIG. 1 is a package top view showing an example of a QFN type package structure of a semiconductor integrated circuit device manufactured by a semiconductor integrated circuit device manufacturing method according to an embodiment of the present invention. FIG. 2 is a package bottom view showing an example of the package structure of the semiconductor integrated circuit device manufactured by the method of the embodiment. FIG. 3 is a package sectional view corresponding to the section X-X' in FIGS. 1 and 2 (also corresponding substantially to the section X-X' in FIG. 5). FIG. 28 is an entire perspective view of a package for explaining problems involved in a conventional QFN type package structure. With reference to these figures, a description will be given below about a package structure, etc. of a semiconductor integrated circuit device manufactured by a semiconductor integrated circuit device manufacturing method according to an embodiment of the present invention.

A description will be given first about a QFN type plastic package. The QFN type plastic package is similar to QFP (Quad Flat Package). In the QFN type plastic package, however, as shown in FIG. 28, a large number of leads 4 are projecting about 0.1 to 0.5 mm from the bottom ends of the side faces 2d which correspond to the sides of a package upper surface 2a, with lead-to-lead spaces being sealed by resin projecting portions 54. Accordingly, there accrues an advantage that packaging area can be saved in comparison with the QFP having leads extending relatively long from the package side faces.

However, in a state in which the side faces of the leads 4 are almost covered with resin, it is impossible to effect solder reflow packaging to a satisfactory extent. In this connection there has been adopted a measure such that the lead-to-lead resin projecting portions 54 are scraped off mechanically, allowing the side faces of the leads 4 to be exposed partially or wholly. Therefore, the following description is now provided about the QFN type plastic package with the lead-to-lead resin projecting portions 54 removed by a suitable method.

Reference will first be made to the package upper surface. As shown in FIG. 1, the upper surface 2a of the package is in a generally quadrangular shape (substantially square in the illustrated example). Although the upper surface is octagonal because there are chamfered corners 2c, the size of each chamfered corner 2c is small as compared with the package diameter, so the upper surface can basically be regarded as a quadrangular shape (square or rectangle). The leads 4 are projected, for example, 0.3 mm or so from the bottom ends of the side faces 2d which correspond to the sides respectively of the package upper surface 2a. From the bottom ends of the chamfered corners 2c there project bumpers 7 for visual inspection in cooling and packaging.

The following description is now provided about a package lower surface. As shown in FIG. 2, a lower surface 3b of a die pad is exposed for heat dissipation to a central part of a package lower surface 2b. The shape of the die pad lower surface 3b is substantially the same as the planar shape of the package. In the illustrated example it is substantially square (generally a quadrangular shape, including a rectangular shape), having four sides 3d. Suspending leads 9 (leads for suspending the die pad) are partially exposed near the bumpers 7.

A description will now be given about the section X-X' in FIGS. 1 and 2. As shown in FIG. 3, a back surface 1b of a semiconductor chip 1 is fixed through, for example, a silver paste layer (DAF will do) to an upper surface 3a of the die pad 3 which is located centrally of the package resin sealing body 2. Leads 4 are projected from bottom ends of side faces 2d of the resin sealing body 2. Bonding pads formed on an upper surface 1a of the semiconductor chip 1 and inner ends of the leads are coupled together through gold wires 6 containing gold as a principal component. It is bus bars 5 that are seen between the leads 4 and the die pad 3. One feature of the QFN type plastic package as compared with QFP is that lower surfaces 4b of the leads 4 and a lower surface 2b of the sealing body 2 are almost flush with each other and that the leads 4 project from the bottom ends of the side faces 2d of the sealing body 2 substantially rectilinearly up to external ends of the leads 4. According to this manufacturing method, the lower surface of the lead frame coincides with that of the package and therefore the lower surface 3b of the die pad configures a central part of the package lower surface 2b.

For example, basic dimensions of the package are as follows. Lead thickness is about 0.2 mm (a suitable range is 0.1 to 0.3 mm), lead pitch is about 0.5 mm (a suitable range is 0.2 to 0.8 mm), lead projection length (L in FIG. 24) is about 0.3 mm (a suitable range is 0.1 mm to 0.5 mm, more preferably 0.2 to 0.4 mm), package width (sealing body width) is about 8 mm (a suitable range is 3 to 10 mm), package thickness (sealing body thickness) is about 0.8 mm (a suitable range is 0.3 to 1.2), and the number of leads (pins) is about 64 (a useful application range is about 20 to 150, but preferably 40 or more, more preferably 50 or more).

Figure 4:
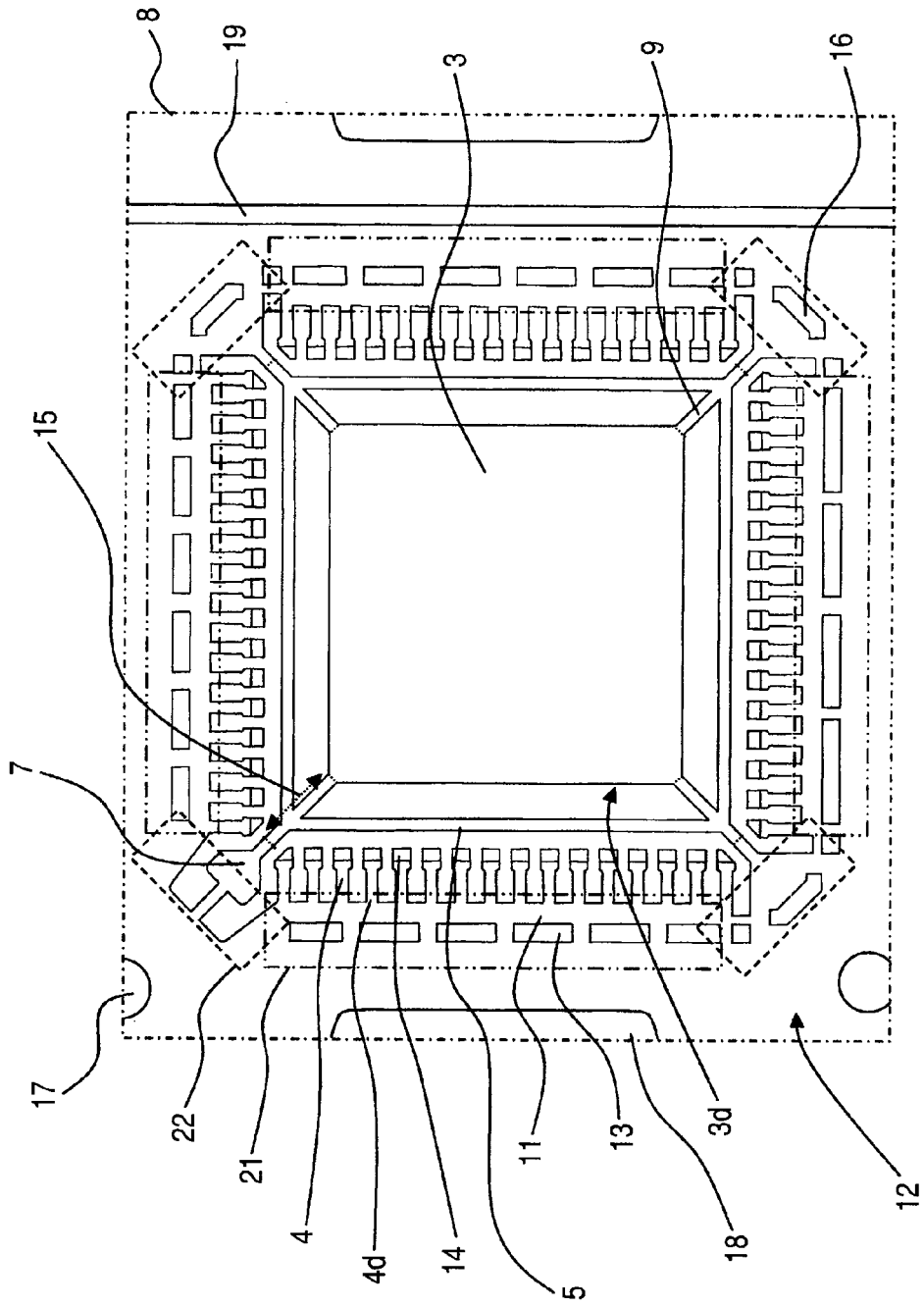
FIG. 4 is an enlarged top view of a unit device region in a lead frame used in the semiconductor integrated circuit device manufacturing method according to the embodiment of the present invention.
Figure 5:
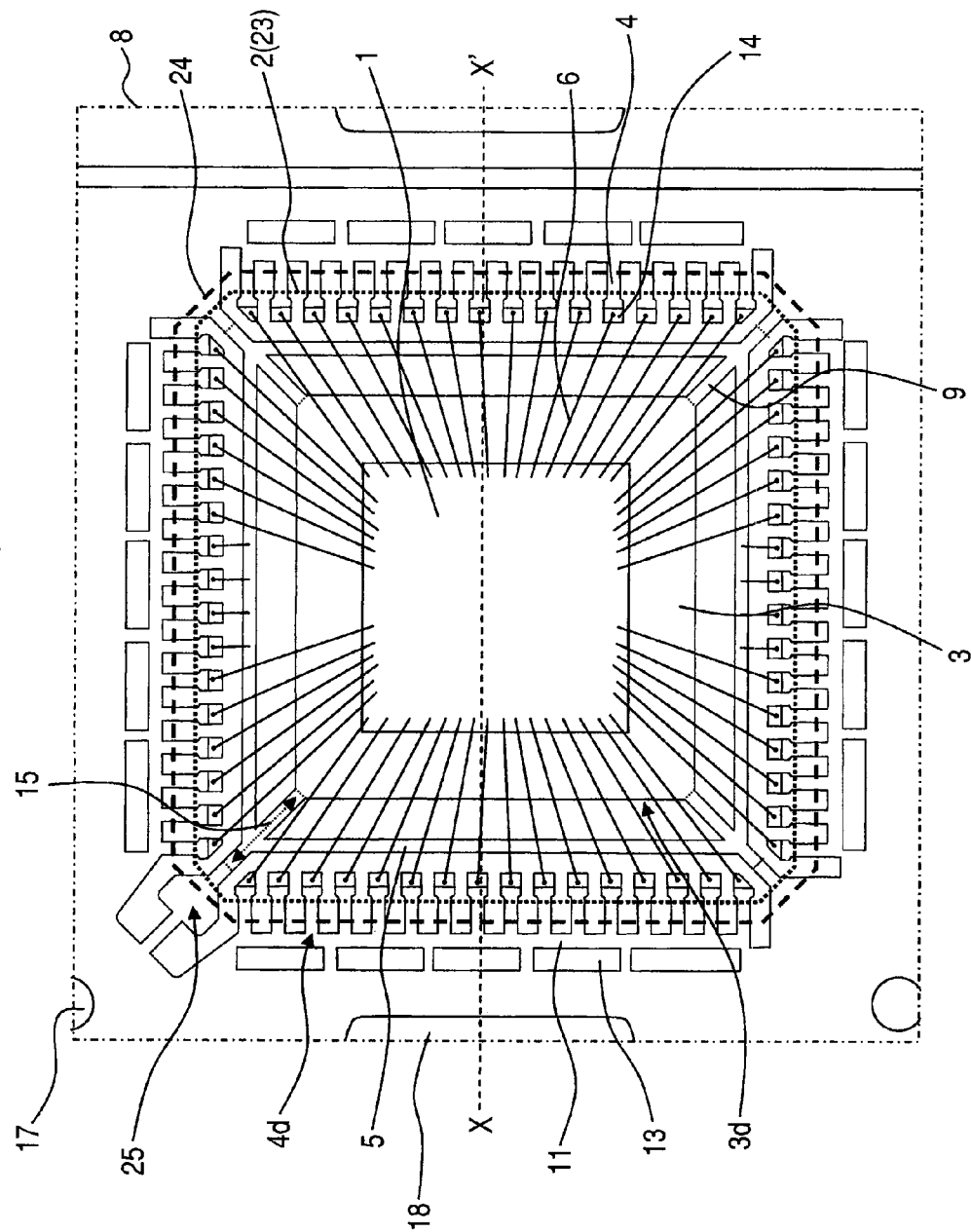
FIG. 5 is an enlarged perspective top view of a unit device region in the lead frame during execution (before a resin sealing body separating process) of the semiconductor integrated circuit device manufacturing method according to the embodiment of the present invention.
Figure 6:
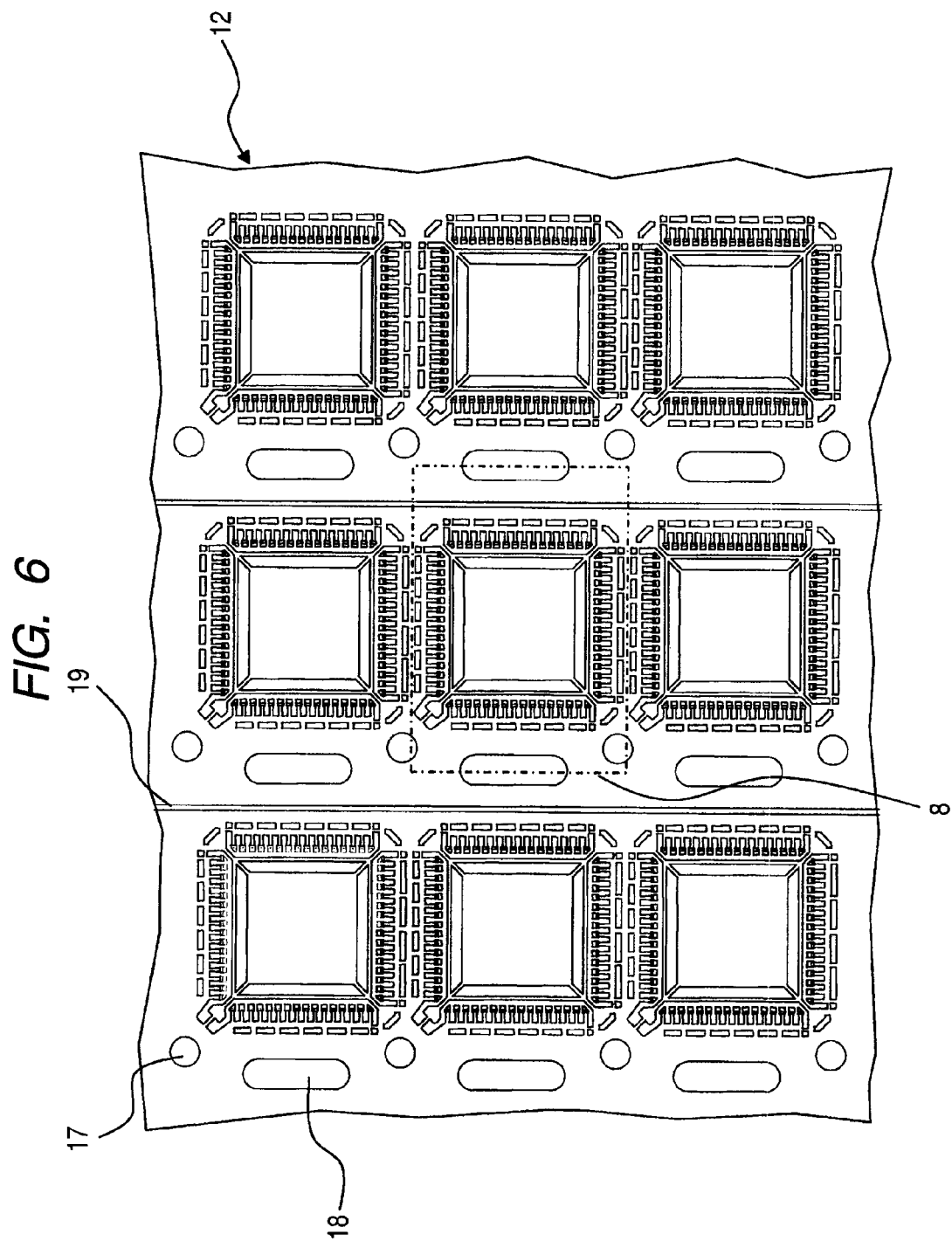
FIG. 6 is an enlarged top view of nine unit device regions in the lead frame used in the semiconductor integrated circuit device manufacturing method according to the embodiment of the present invention.
Figure 7:
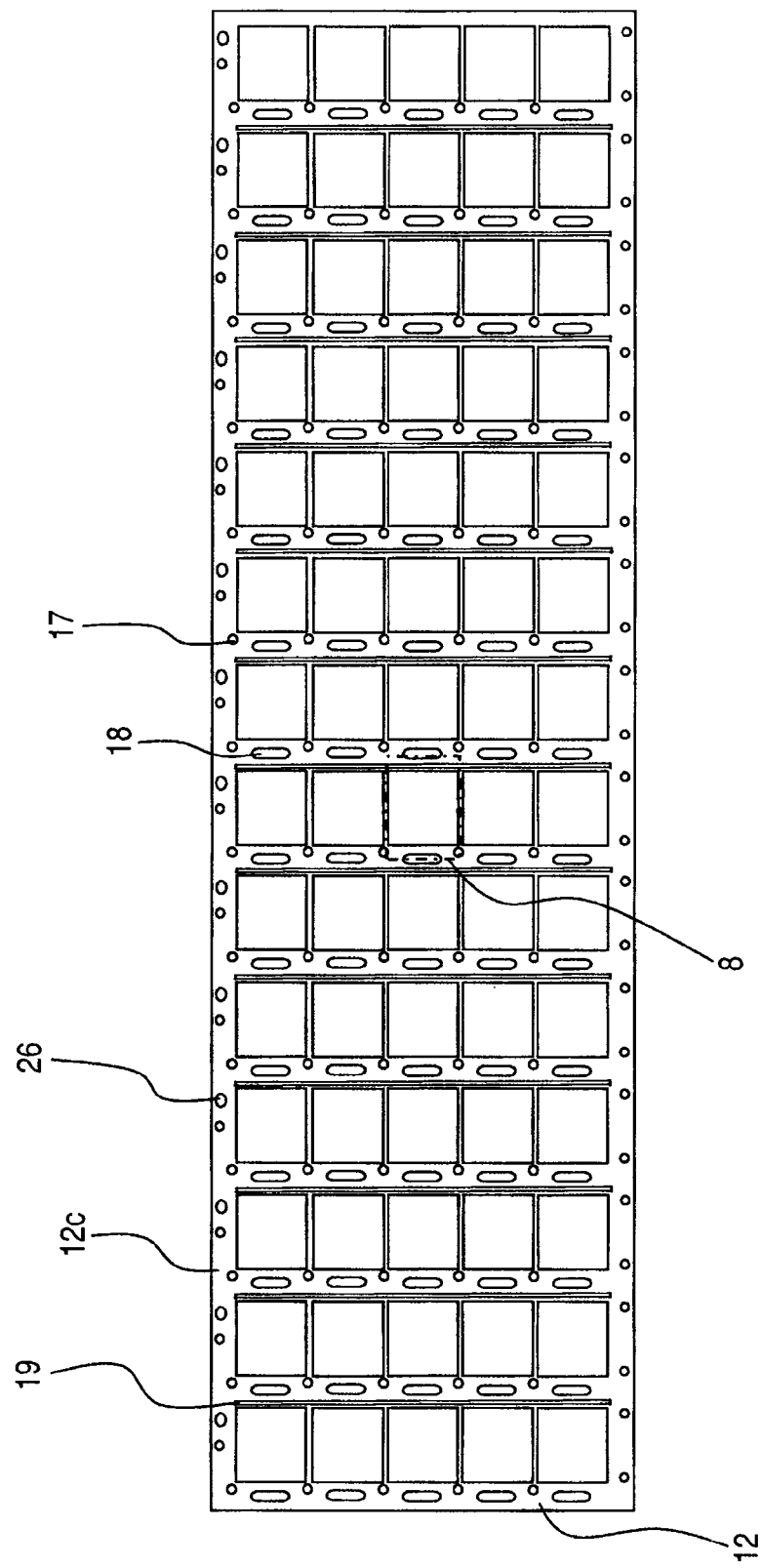
FIG. 7 is an entire top view of the lead frame used in the semiconductor integrated circuit device manufacturing method according to the embodiment of the present invention.

2. Explanation of the structure of a lead frame used in the method of the embodiment (mainly FIGS. 4 to 7):

FIG. 4 is an enlarged top view of a unit device region in a lead frame used in the method of the embodiment. FIG. 5 is an enlarged perspective top view of a unit device region in the lead frame during execution (before a resin sealing body separating process) of the method of the embodiment. FIG. 6 is an enlarged top view of nine unit device regions in the lead frame used in the method of the embodiment. FIG. 7 is an entire top view of the lead frame used in the method of the embodiment. With reference to these figures, a description will now be given about the structure of the lead frame used in the method of the embodiment. The material of the lead frame is, for example, a cupreous material containing copper as a principal component and also containing tin and nickel. It may be a Zr-added cupreous material, an iron-added cupreous material, or any other cupreous material. The lead frame is patterned by etching. Etching may be substituted for by punching, but etching is superior in the accuracy of fine patterning and is effective, for example, in its combination with half-etching.

First, an entire structure of the lead frame 12 will be described with reference to FIG. 7. In a so-called multi-device lead frame, as shown in FIG. 7, unit device regions 8 are arranged in a matrix shape. In both-side frame portions 12c of the lead frame 12 there are formed guide pin holes 26 (or pilot holes) for feed. Between adjacent unit device region columns arranged in the longitudinal direction there are formed slits 19 for absorbing warp. Apertures 17 and 18 to be used for removing unnecessary resin, in runner and gate portions in the sealing process, for example, are formed in boundary portions between adjacent unit device regions 8.

Next, a more detailed description will be given about the interior of each unit device region 8. As shown in FIG. 4, centrally located is the die pad 3 and it is the suspending leads 9 that are fixed to the bumpers 7 located at peripheral positions. Anti-warp slits 16 are provided at the peripheral portion to prevent warping of the die pad 3. The suspending leads 9 also function to hold the bus bars 5. The whole of the bus bars 5 and half-etched portions 15 of the suspending leads 9 are half-etched from the back surface side. (As to the bus bars 5 it is intended to cover their lower surfaces with resin. Half-etching inner ends of the leads 4 and lower portions of the die pad peripheral edge is effective in preventing dislodgment.) For improving the wire bondability, bonding metal layers 14 containing, for example, silver as a principal component are formed, for example, by plating respectively on inner end portions of upper surfaces of the leads 4. The leads 4 are coupled together by a tie bar 11 in the vicinity of their outer ends 4d. A linear aperture row 13 is provided between the tie bar 11 and the lead frame body. Dash-double dot lines indicate a projection pattern of a punching die 21 for separating the tie bar portion from the sealing body. Likewise, a broken line at each corner indicates a projection pattern of a punching die 22 for separating the associated bumper 7 from the surrounding lead frame body.

Next, a description will be given about a relation among the semiconductor chip, sealing body, bonding wires and a cutting portion in the internal structure of each of the unit device regions 8. As shown in FIG. 5, the semiconductor chip 1 is attached to the central part of the die pad 3. A large number of bonding pads on the semiconductor chip and most of the leads 4 (silver-plated portions) are coupled together through bonding wires. A portion of the leads and bus bars 5 are also coupled together through bonding wires. A boundary of the resin sealing body 2 (serving also as a boundary of a mold cavity) is indicated by a dotted line. On the other hand, a broken line 24 indicates a cutting portion for separating the resin sealing body 2 from the lead frame body. A gate portion for the injection of resin is indicated at an arrow 25.

Figure 8:
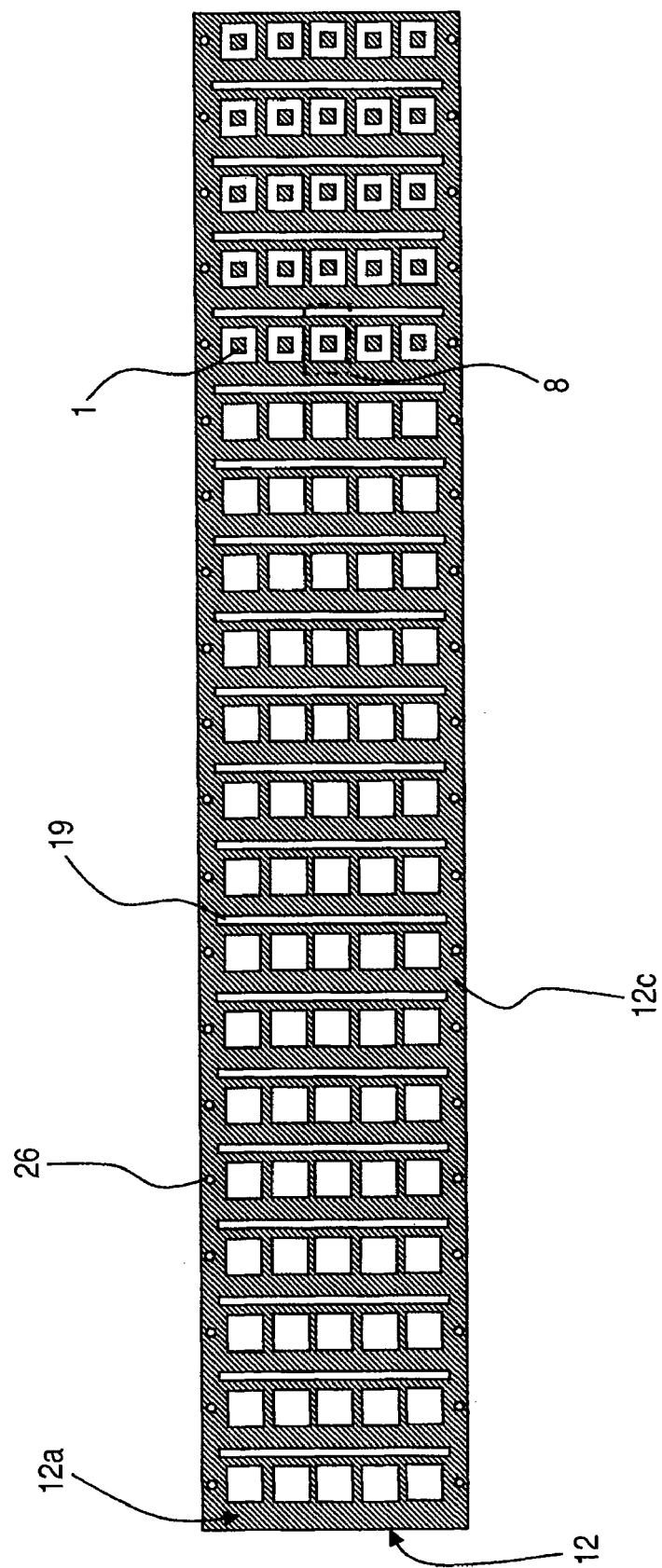
FIG. 8 is an entire top view of the lead frame during execution (during die bonding) of the semiconductor integrated circuit device manufacturing method according to the embodiment of the present invention.
Figure 9:
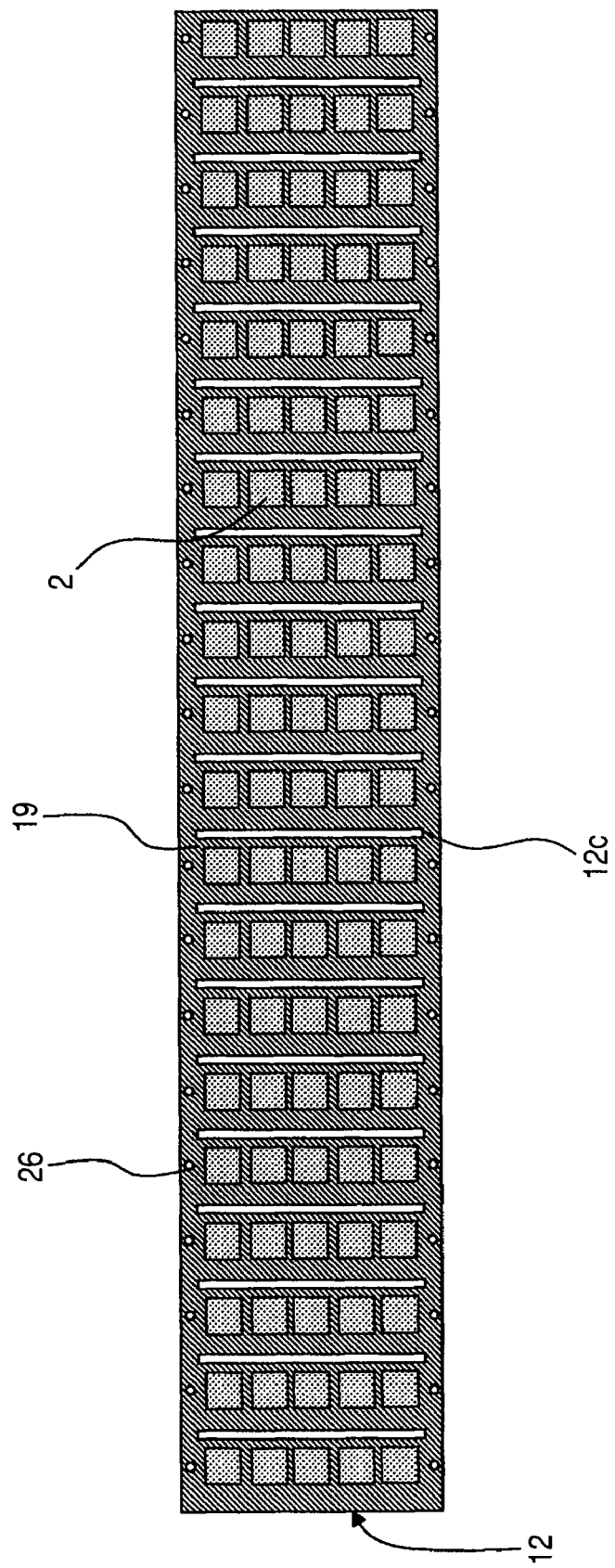
FIG. 9 is an entire top view of the lead frame during execution (a sealing process is completed) of the method of the embodiment.
Figure 10:
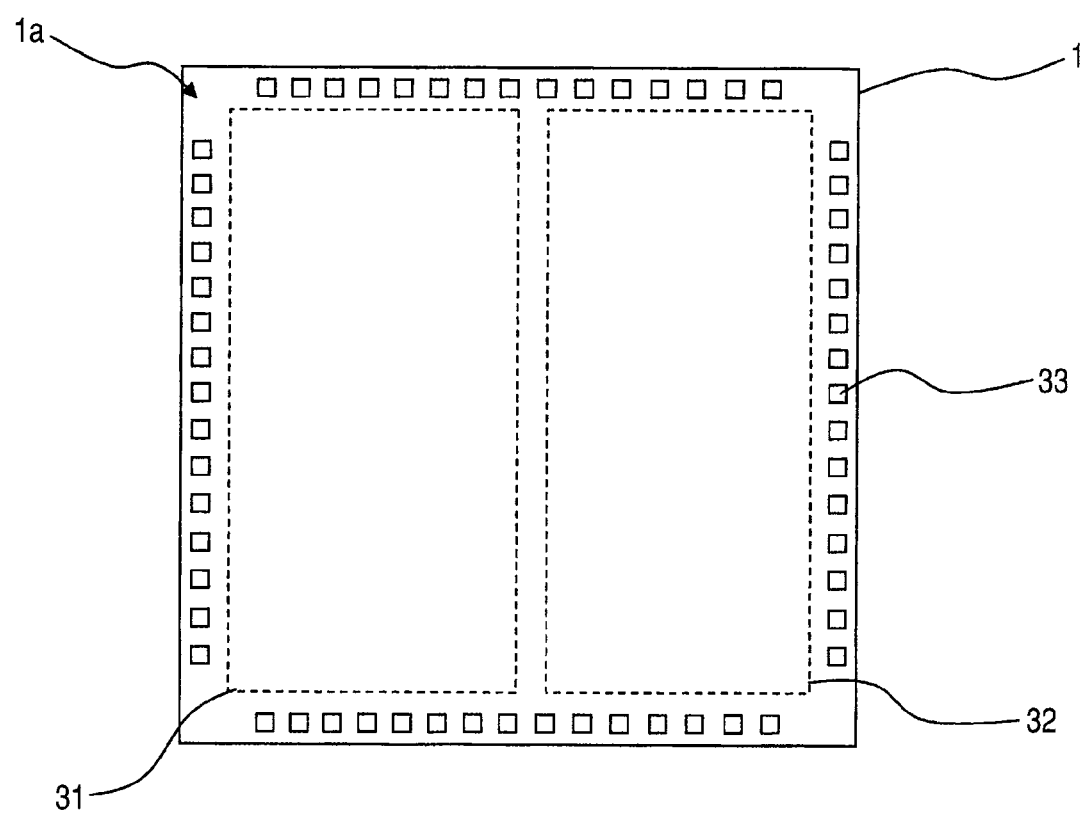
FIG. 10 is a planar circuit layout diagram showing an example of a semiconductor chip used in the semiconductor integrated circuit device manufacturing method according to the embodiment of the present invention.
Figure 11:
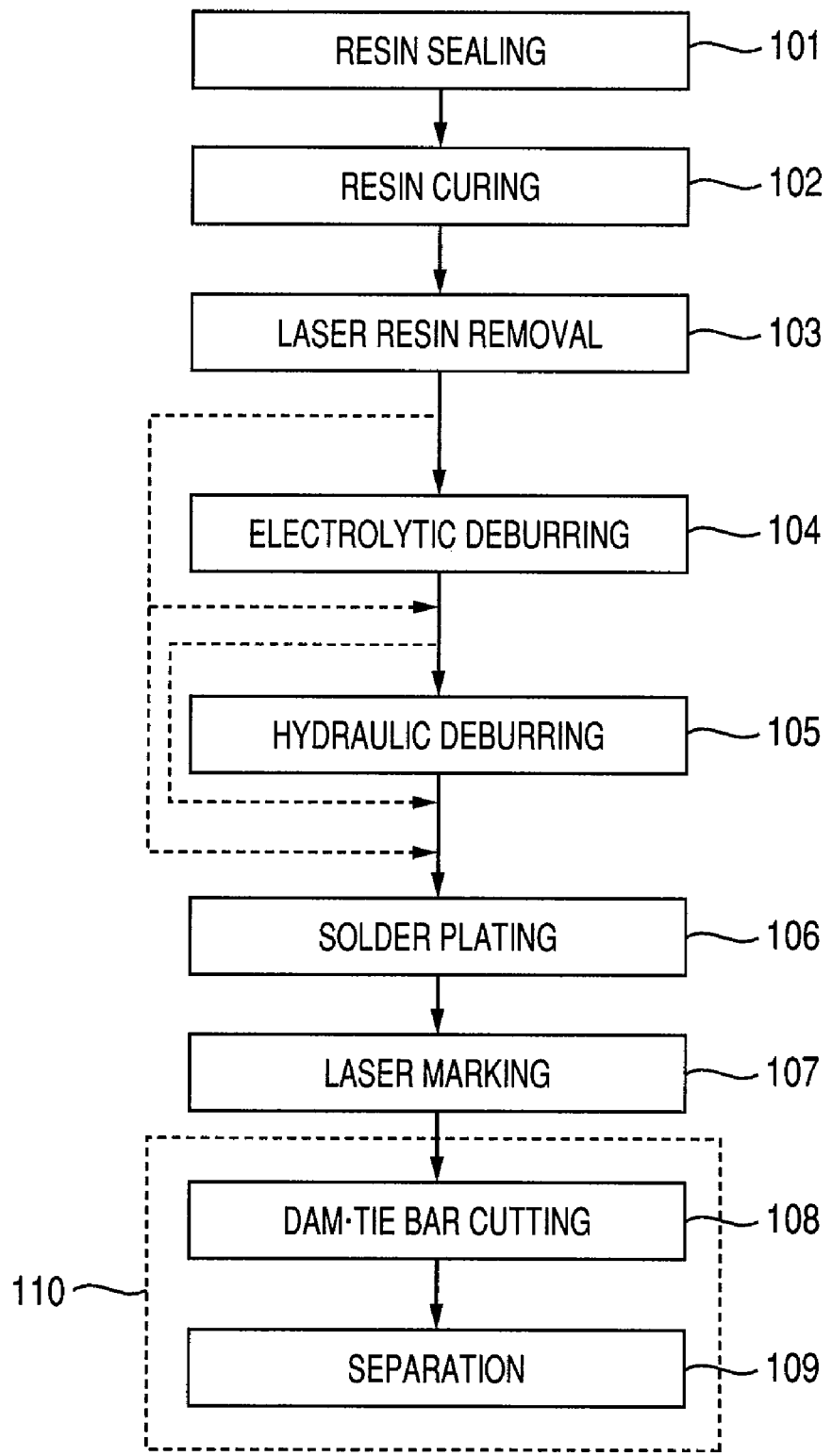
FIG. 11 is a main process block flow diagram in the semiconductor integrated circuit device manufacturing method according to the embodiment of the present invention.
Figure 12:
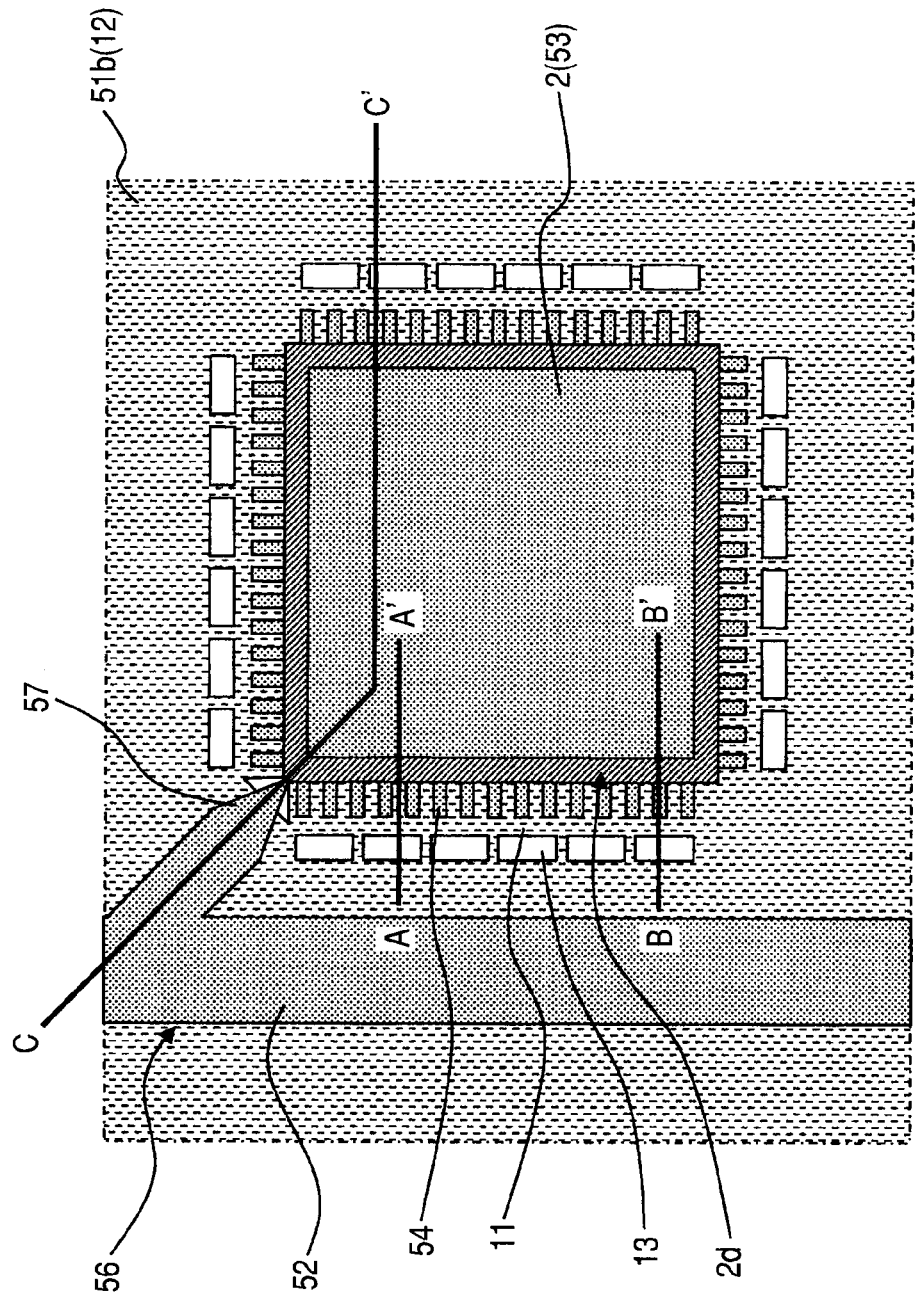
FIG. 12 is a top view of one element process (sealing process) in the semiconductor integrated circuit device manufacturing method according to the embodiment of the present invention (in this top view an upper die is removed for easier understanding)
Figure 13:
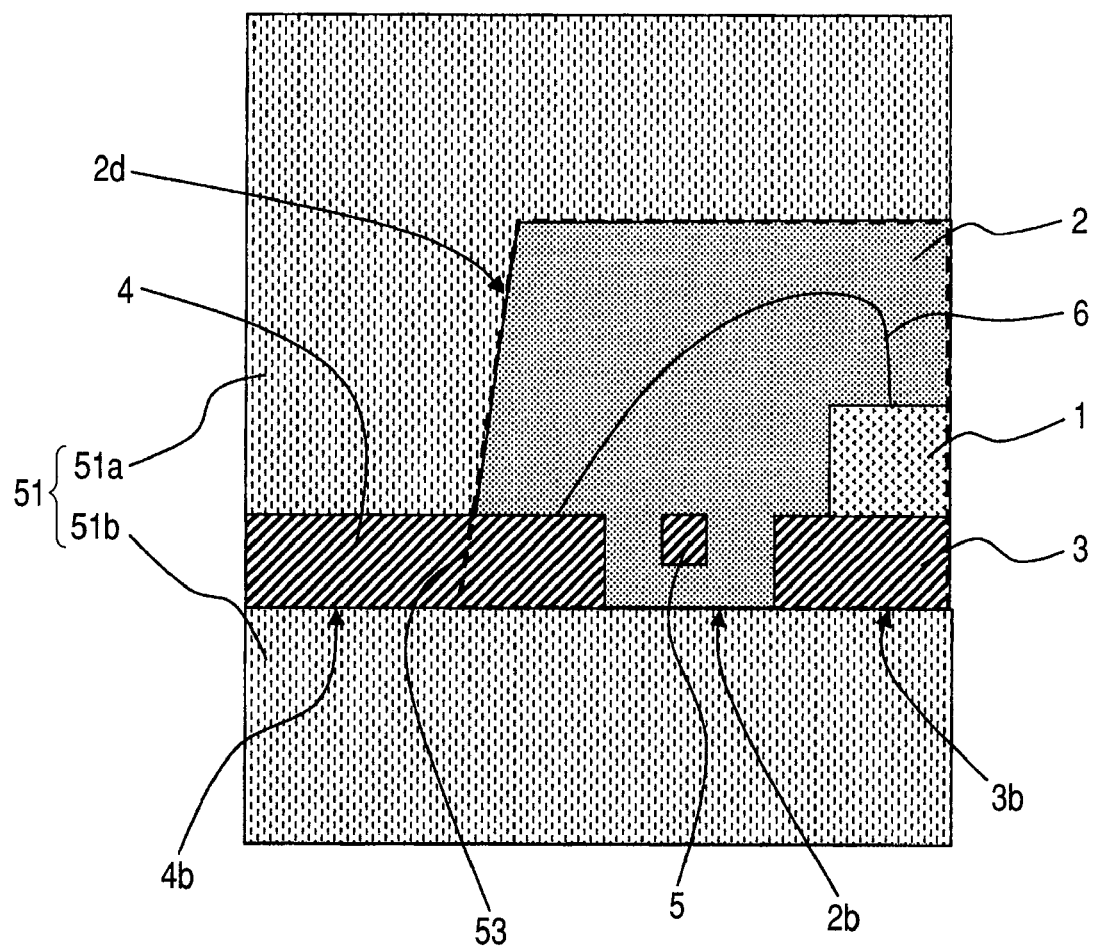
FIG. 13 is a sectional view of a molding die and a device corresponding to the section A-A' in FIG. 12.
Figure 14:
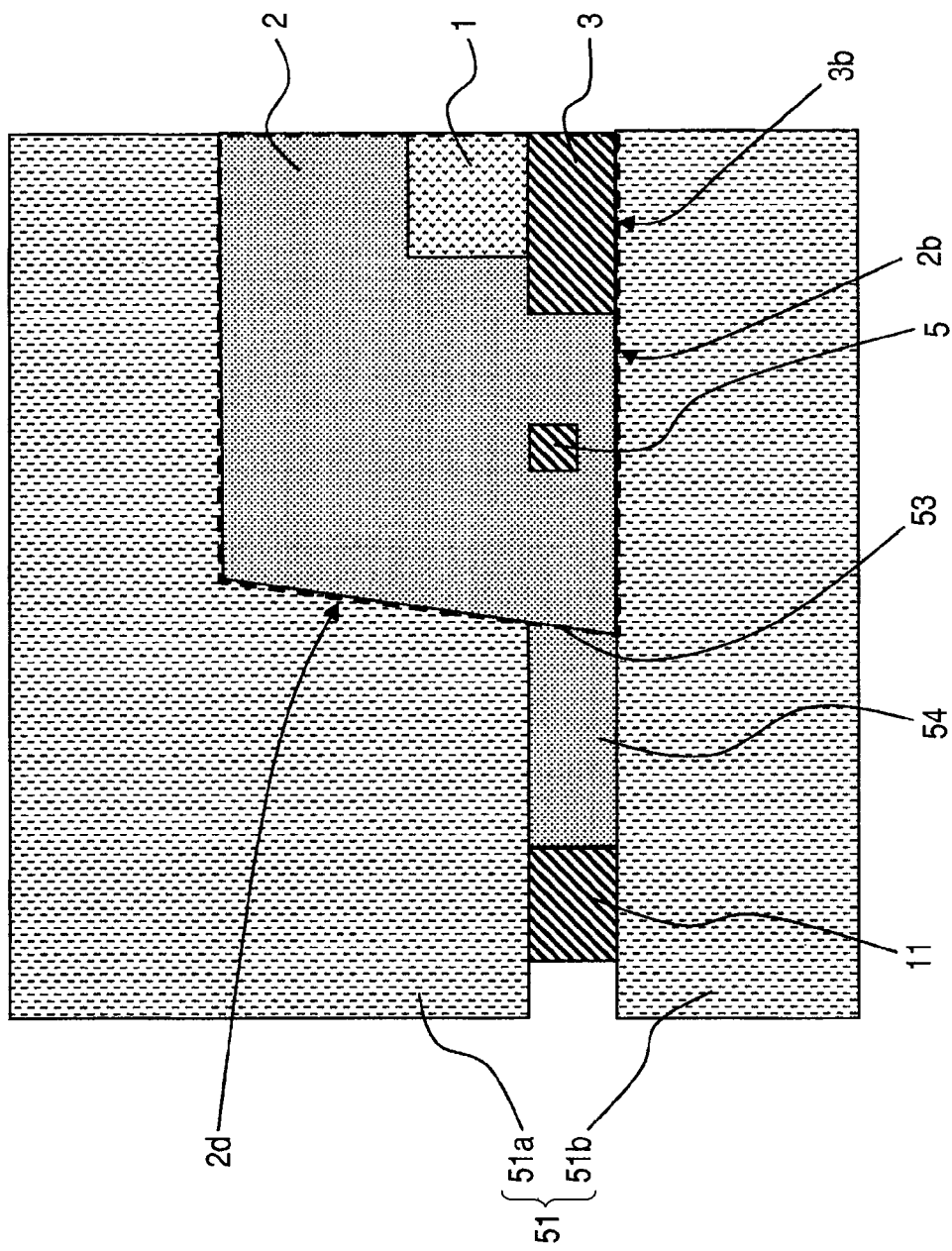
FIG. 14 is a sectional view of the molding die and the device corresponding to the section B-B' in FIG. 12.
Figure 15:
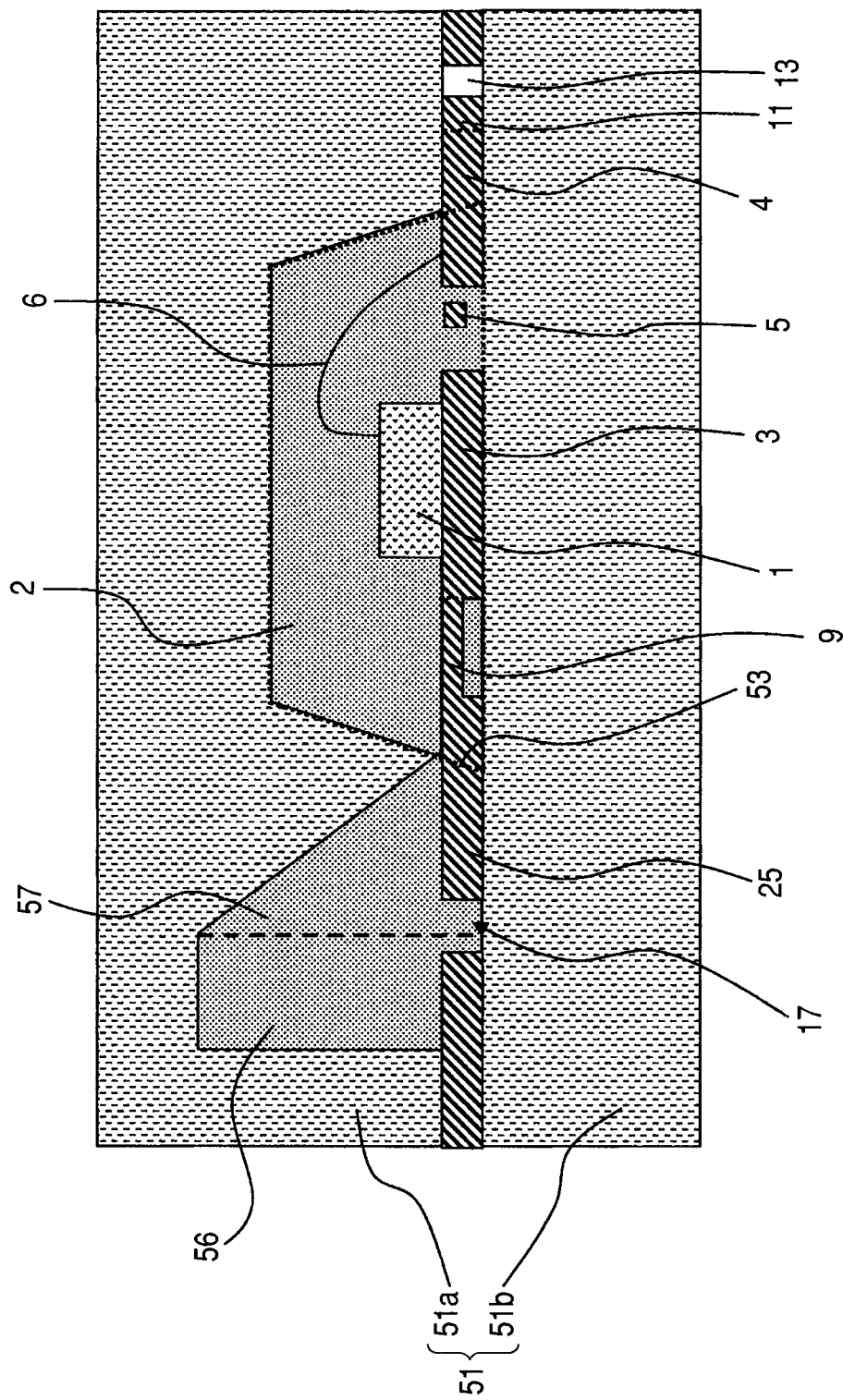
FIG. 15 is a sectional view of the molding die and the device corresponding to the section C-C' in FIG. 12.
Figure 16:
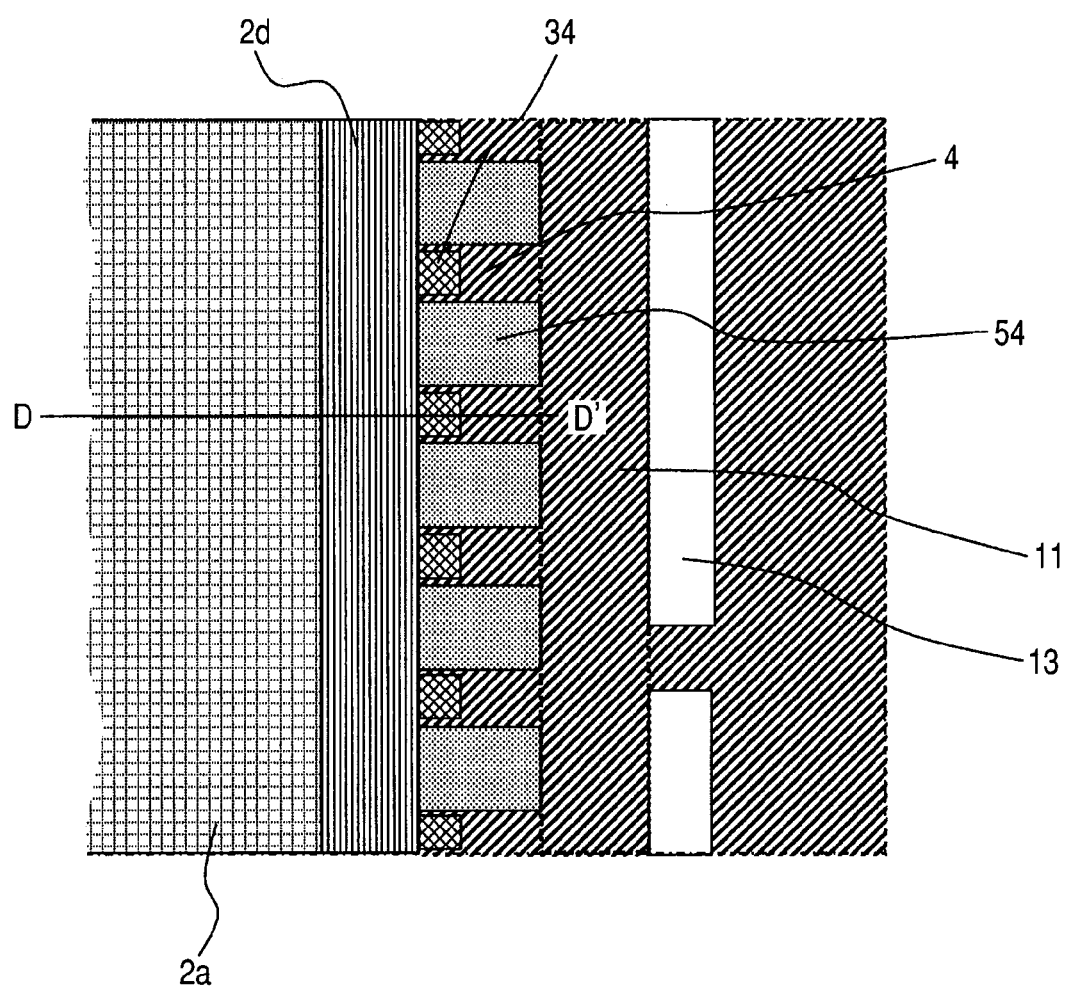
FIG. 16 is a partial enlarged top view of a unit device region in the lead frame during execution (the sealing process is completed) of the semiconductor integrated circuit device manufacturing method according to the embodiment of the present invention.
Figure 17:
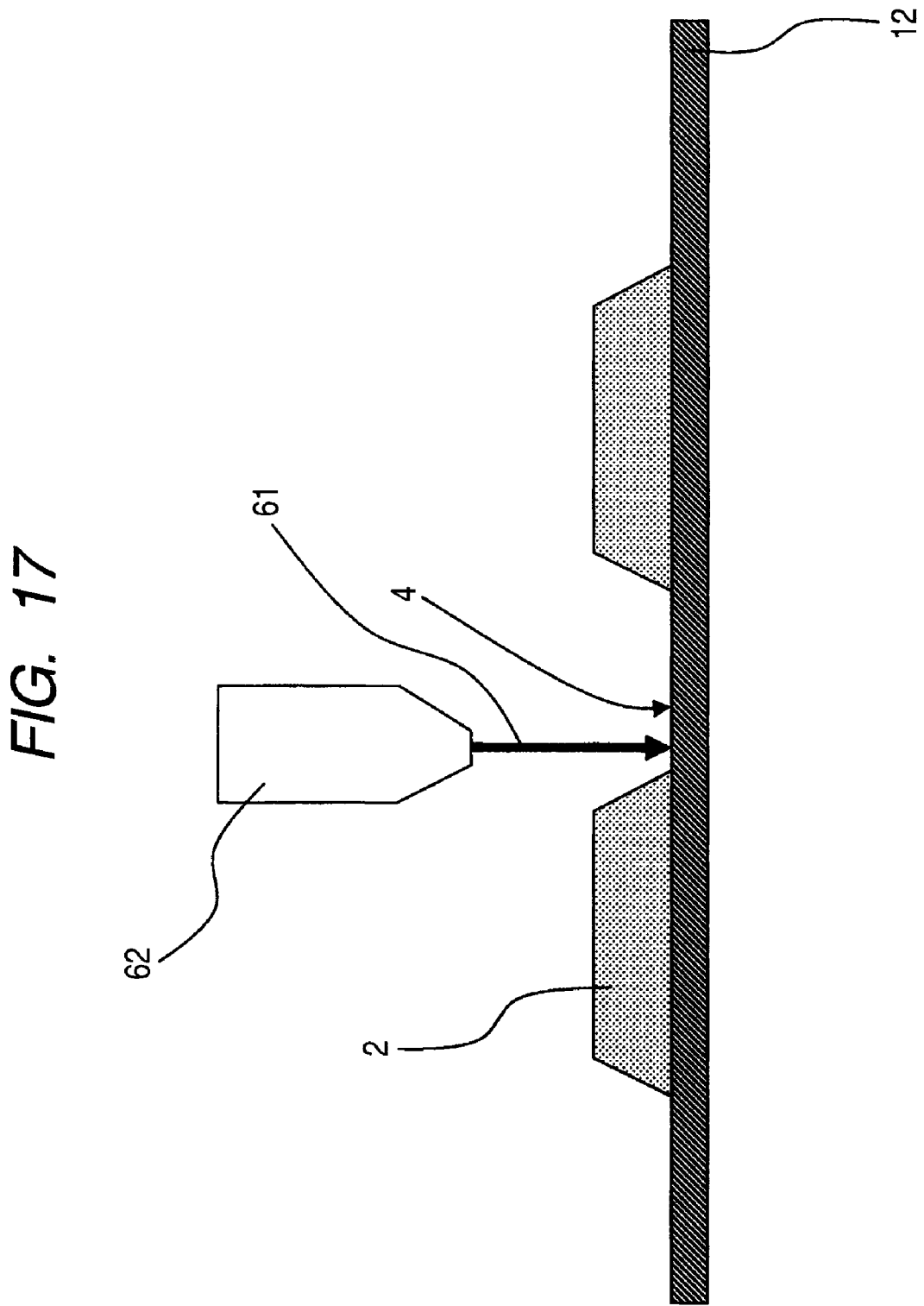
FIG. 17 is a partial front view of the lead frame for explaining the state of processing performed in one element process (a lead-to-lead resin projection removing process using a laser) in the semiconductor integrated circuit device manufacturing method according to the embodiment of the present invention.
Figure 18:
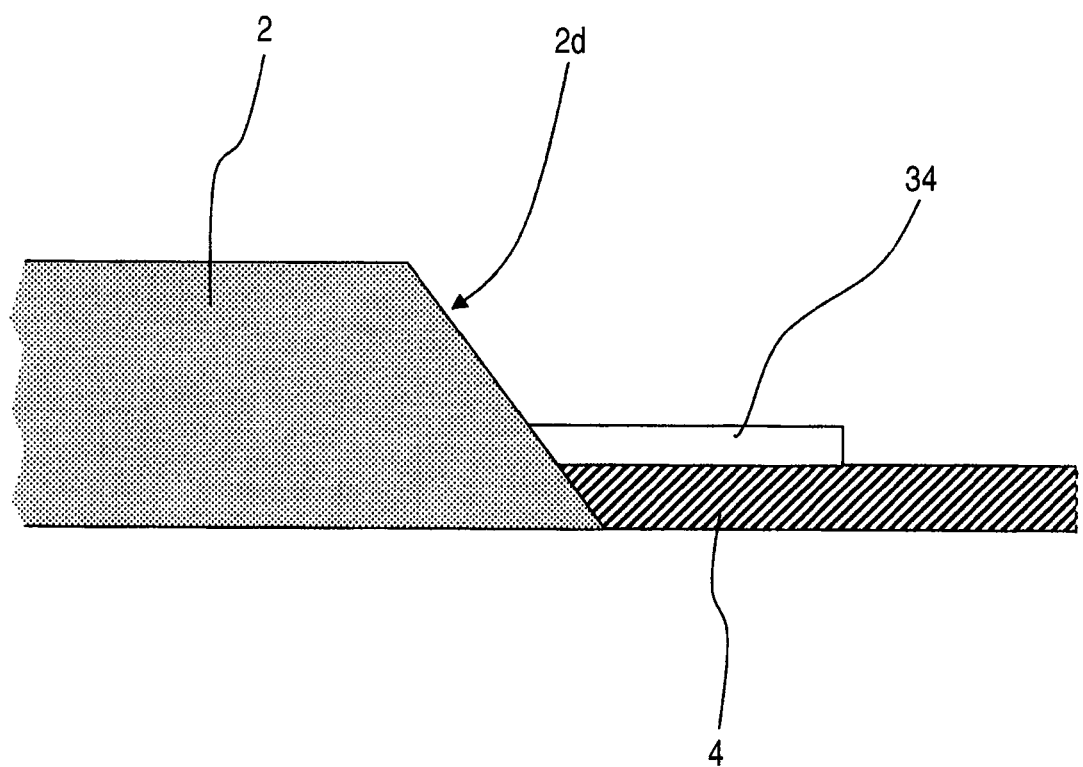
FIG. 18 is a sectional view of a device corresponding to the section D-D' in FIG. 16.
Figure 19:
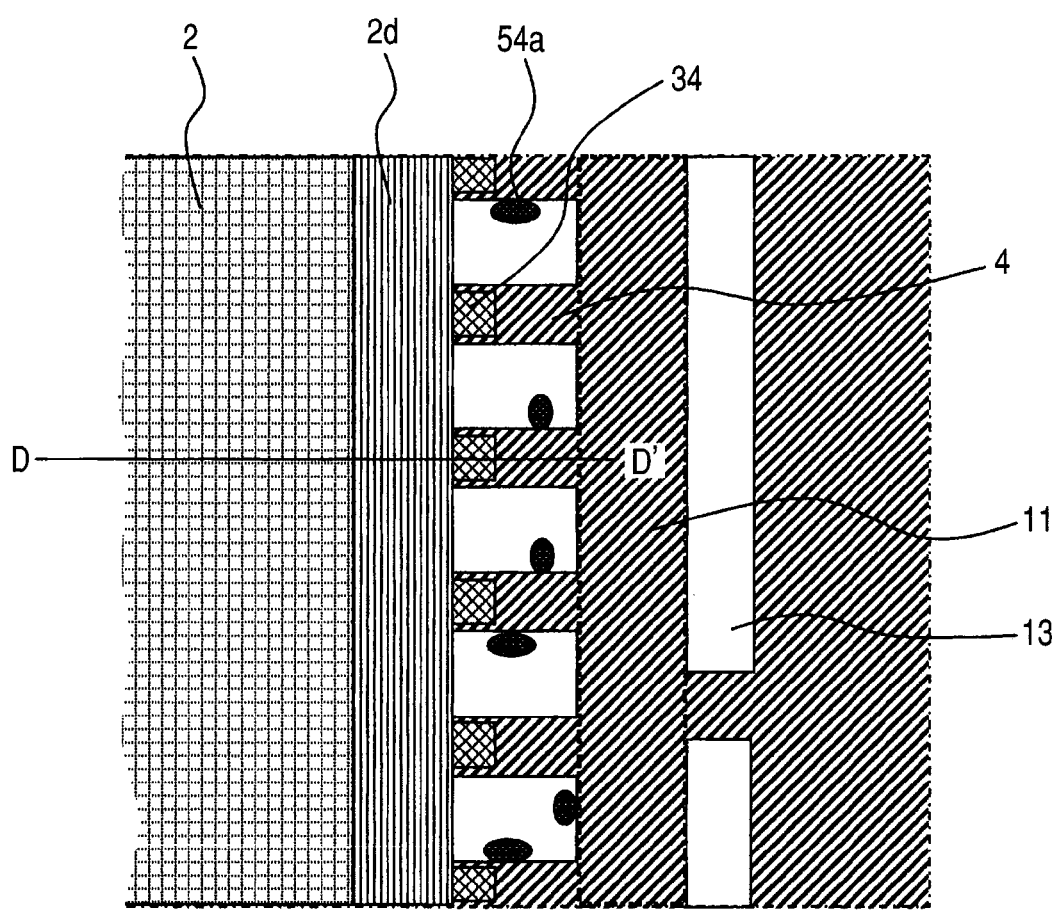
FIG. 19 is a partial front view of the lead frame for explaining the state of processing performed in one element process (an electrolytic residual resin removing process) in the semiconductor integrated circuit device manufacturing method according to the embodiment of the present invention.
Figure 20:
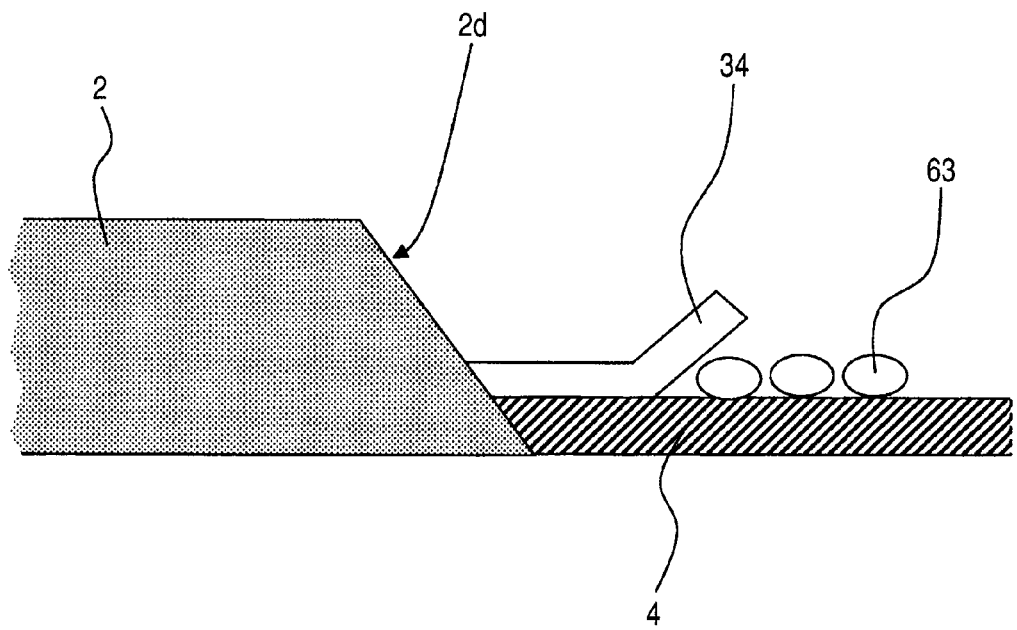
FIG. 20 is a sectional view of a device corresponding to the section D-D' in FIG. 19.
Figure 21:
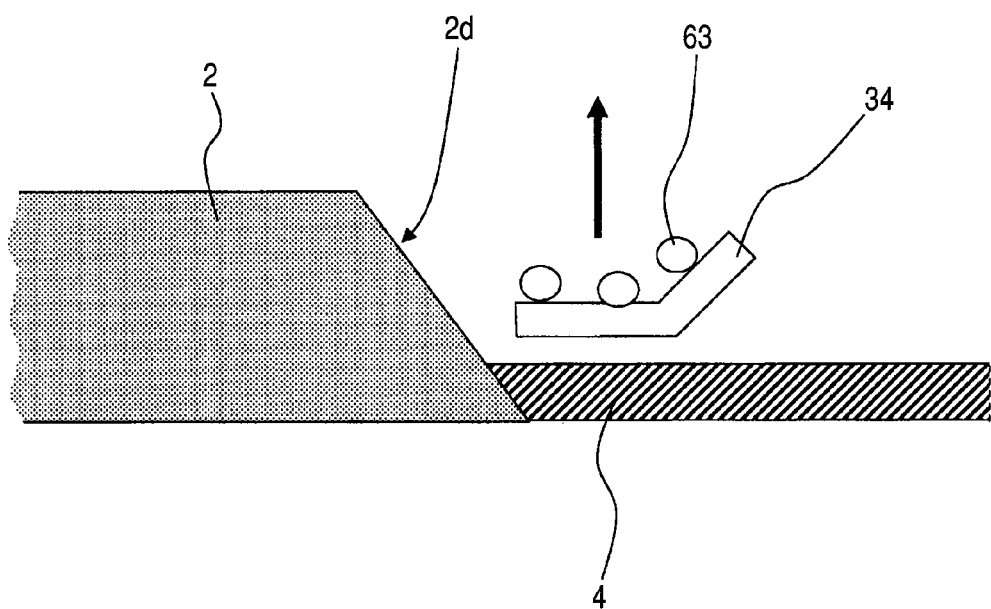
FIG. 21 is another sectional view of a device corresponding to the section D-D' in FIG. 19.
Figure 22:
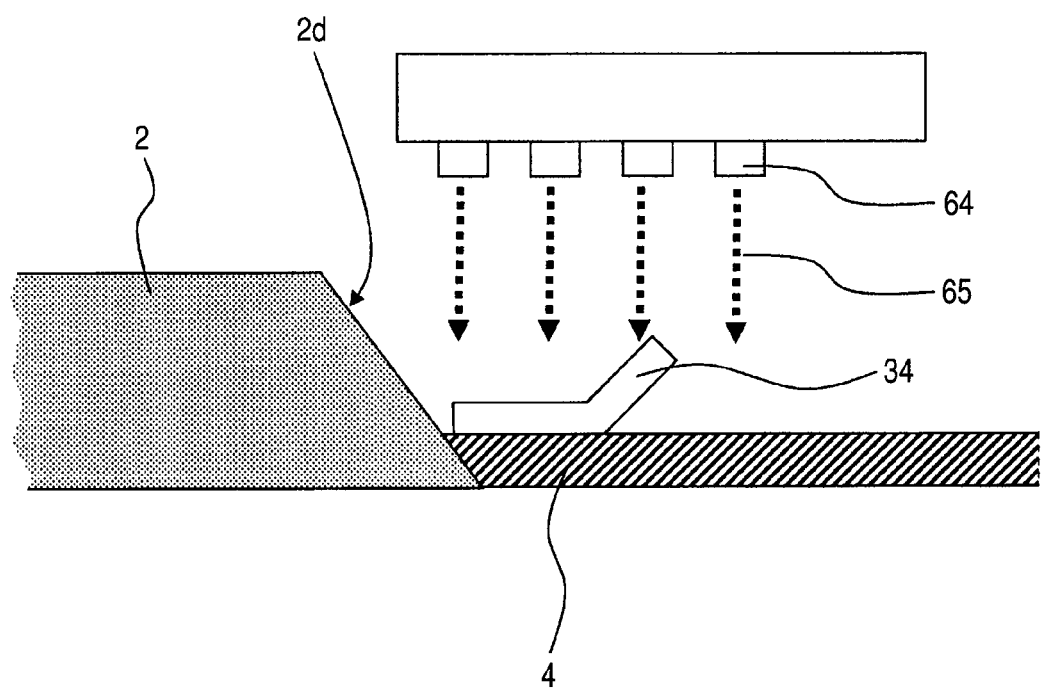
FIG. 22 is a partial front view of the lead frame for explaining the state of processing performed in one element process (a water jet residual resin removing process) in the semiconductor integrated circuit device manufacturing method according to the embodiment of the present invention.
Figure 23:
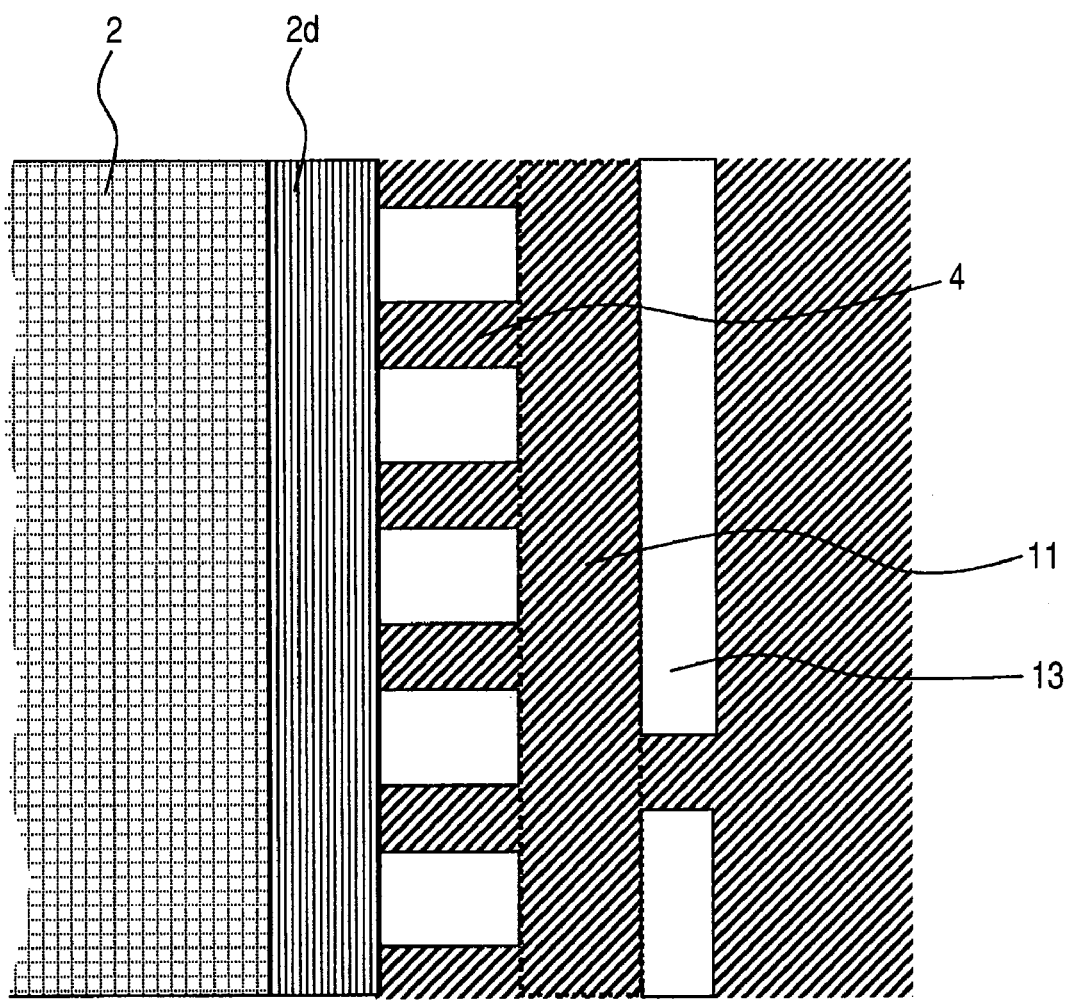
FIG. 23 is a partial enlarged top view of a unit device region in the lead frame during execution (the water jet residual resin removing process is completed) of the semiconductor integrated circuit device manufacturing method according to the embodiment of the present invention.
Figure 24:
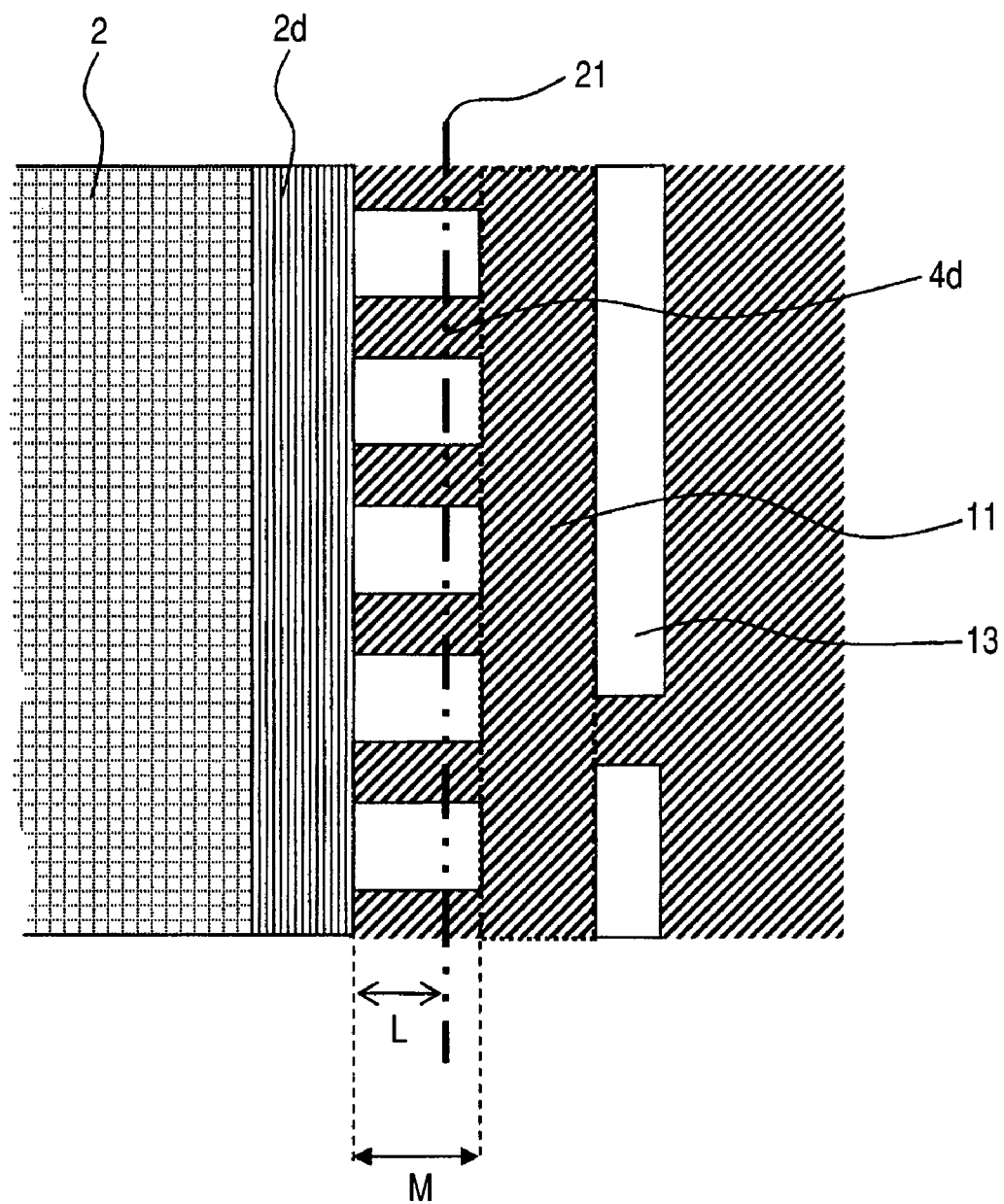
FIG. 24 is a partial enlarged top view of a unit device region in the lead frame during execution (before tie bar cutting) of the semiconductor integrated circuit device manufacturing method according to the embodiment of the present invention.
Figure 25:
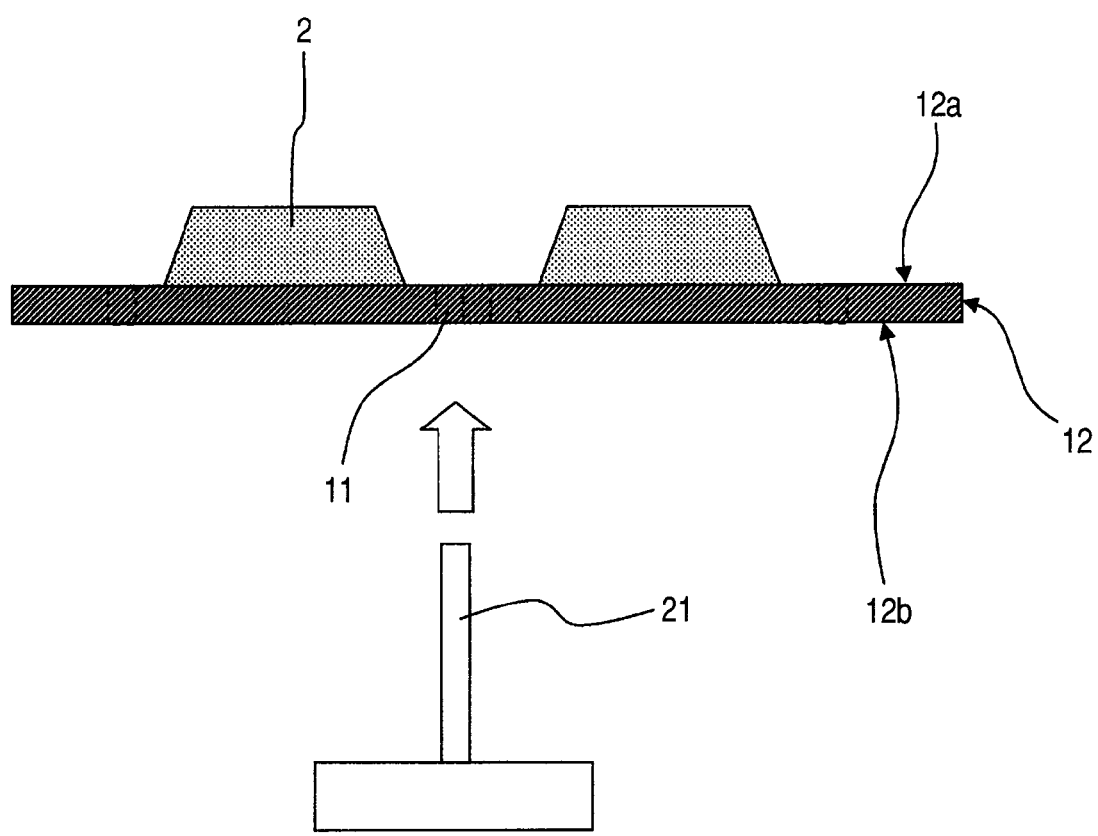
FIG. 25 is a partial front view of the lead frame for explaining the state of processing performed in one element process (a tie bar cutting process) in the semiconductor integrated circuit device manufacturing method according to the embodiment of the present invention.
Figure 26:
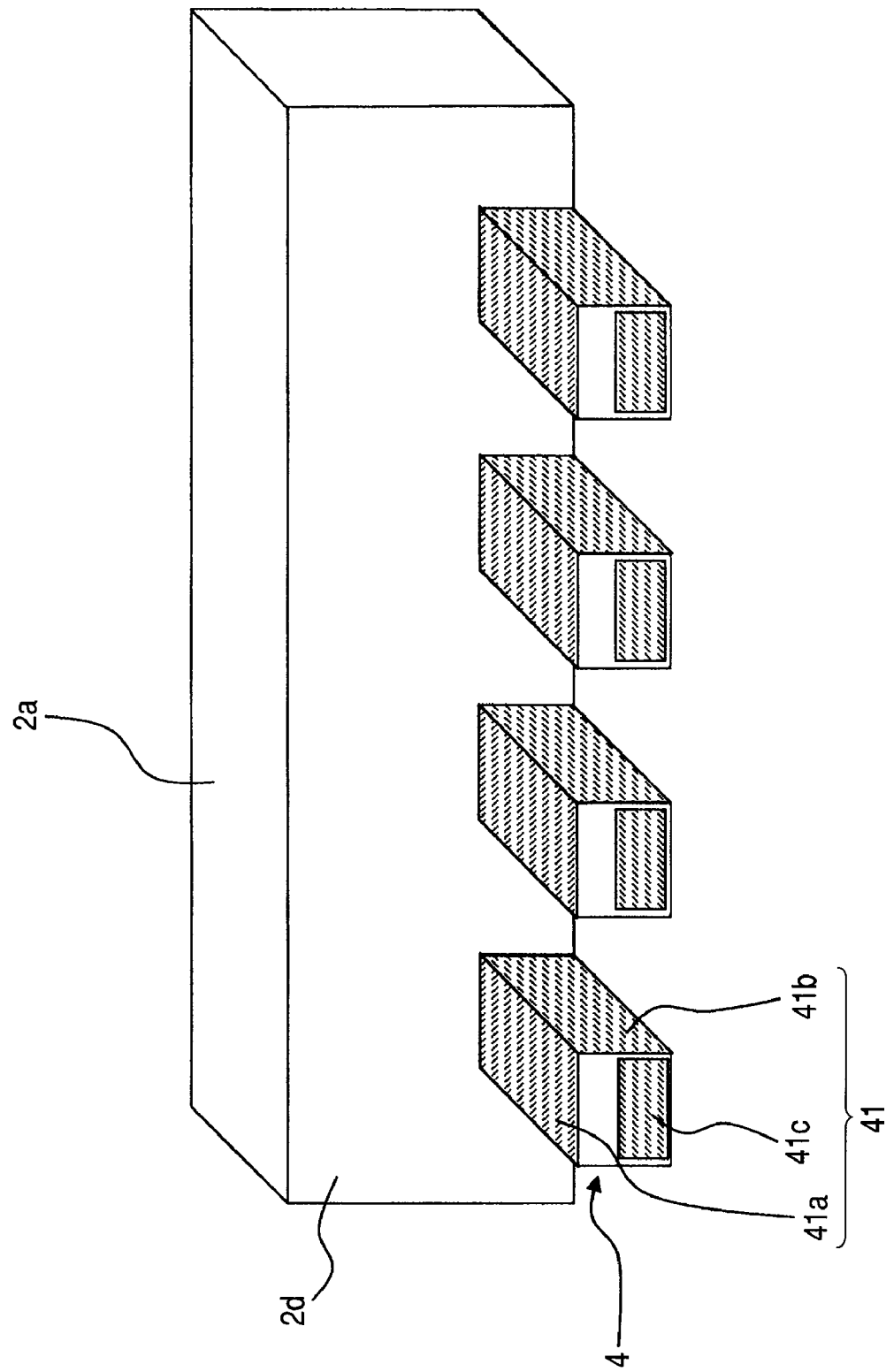
FIG. 26 is a partial perspective view of a resin sealing body (a semiconductor integrated circuit device package) in one element process (after the resin sealing body separating process) in the semiconductor integrated circuit device manufacturing method according to the embodiment of the present invention.
Figure 27:
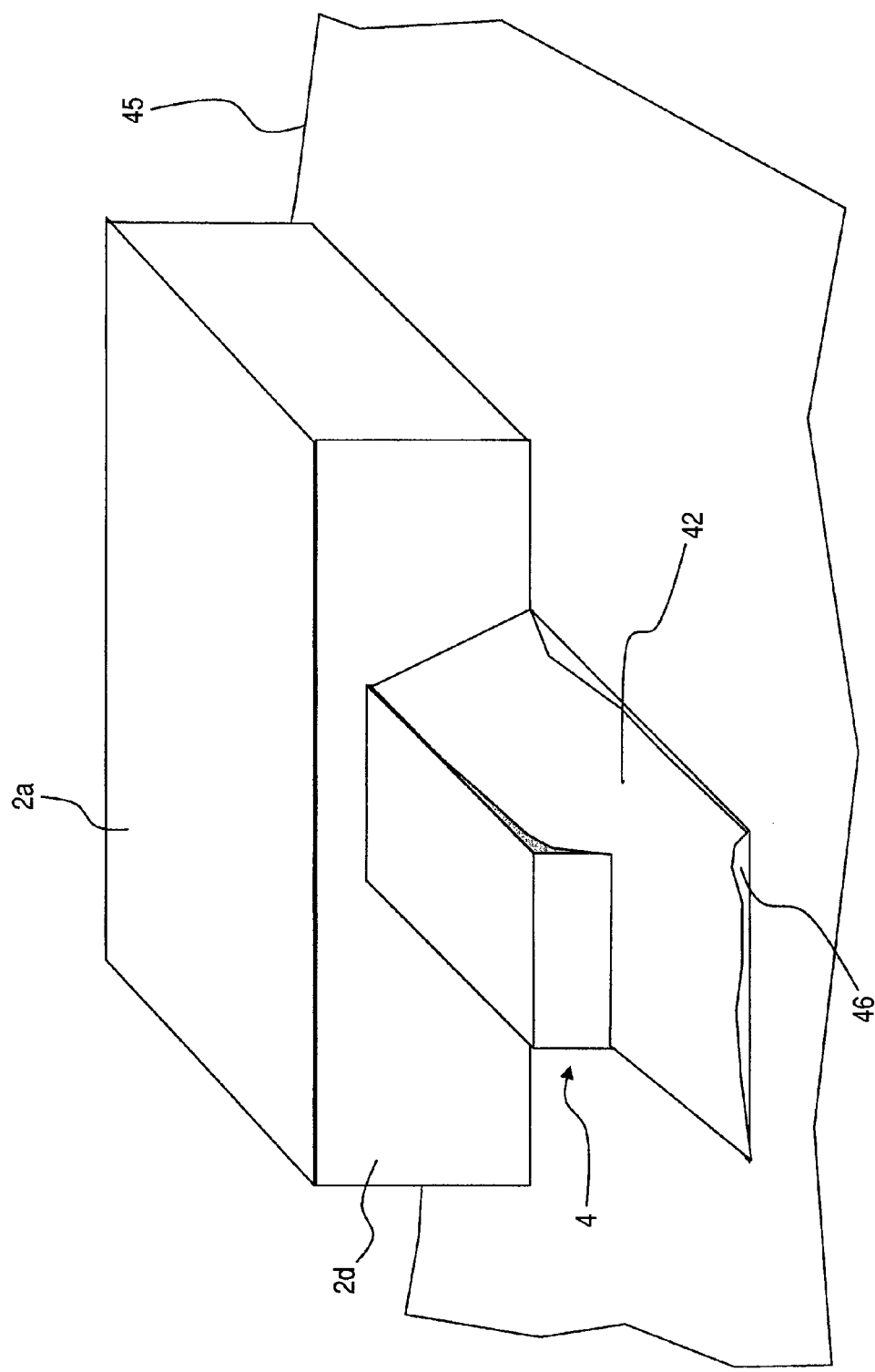
FIG. 27 is a partial perspective view of a wiring substrate and a semiconductor integrated circuit device package, showing a state in which the resin sealing body is mounted on the wiring substrate.

3. Explanation of a processing flow in the method of the embodiment (mainly FIGS. 8 to 27):

FIG. 8 is an entire top view of the lead frame during execution (during die bonding) of the method of the embodiment. FIG. 9 is an entire top view of the lead frame during execution (a sealing process is completed) of the method of the embodiment. FIG. 10 is a planar circuit layout diagram showing an example of a semiconductor chip used in the method of the embodiment. FIG. 11 is a main process block flow diagram in the method of the embodiment. FIG. 12 is a top view of one element process (sealing process) in the method of the embodiment (in this top view an upper die is removed for easier understanding). FIG. 13 is a sectional view of a molding die and a device corresponding to the section A-A' in FIG. 12. FIG. 14 is a sectional view of the molding die and the device corresponding to the section B-B' in FIG. 12. FIG. 15 is a sectional view of the molding die and the device corresponding to the section C-C' in FIG. 12. FIG. 16 is a partial enlarged top view of a unit device region in the lead frame during execution (the sealing process is completed) of the method of the embodiment. FIG. 17 is a partial front view of the lead frame for explaining the state of processing performed in one element process (a lead-to-lead resin projection removing process using a laser) in the method of the embodiment. FIG. 18 is a sectional view of a device corresponding to the section D-D' in FIG. 16. FIG. 19 is a partial front view of the lead frame for explaining the state of processing performed in one element process (an electrolytic residual resin removing process) in the method of the embodiment. FIG. 20 is a sectional view of a device corresponding to the section D-D' in FIG. 19. FIG. 21 is another sectional view of a device corresponding to the section D-D' in FIG. 19. FIG. 22 is a partial front view of the lead frame for explaining the state of processing performed in one element process (a water jet residual resin removing process) in the method of the embodiment. FIG. 23 is a partial enlarged top view of a unit device region in the lead frame during execution (the water jet residual resin removing process is completed) of the method of the embodiment. FIG. 24 is a partial enlarged top view of a unit device region in the lead frame during execution (before tie bar cutting) of the method of the embodiment. FIG. 25 is a partial front view of the lead frame for explaining the state of processing performed in one element process (a tie bar cutting process) in the method of the embodiment. FIG. 26 is a partial perspective view of a resin sealing body (a semiconductor integrated circuit device package) in one element process (after the resin sealing body separating process) in the method of the embodiment. FIG. 27 is a partial perspective view of a wiring substrate and a semiconductor integrated circuit device package, showing a state in which the resin sealing body is mounted on the wiring substrate. With reference to these drawings a description will be given below about a processing flow in the method of the embodiment.

The processing flow will be described in a successive manner in accordance with the process flow of FIG. 11. First, in a wafer process, a semiconductor chip 1 is fabricated. For example, the semiconductor chip 1 is a mixed signal type integrated circuit chip as shown in FIG. 10. The semiconductor chip 1 comprises a large number of bonding pads 33 formed on an upper surface of the chip 1, a bipolar type analog circuit block 31 and an MIS (Metal Insulator Semiconductor) type logic memory circuit block 32. Reference will here be made to an example in which one chip is mounted for each unit device region 8, provided it is understood that plural chips may be fixed. Moreover, in the illustrated example, the chip is fixed onto the die pad, but in case of fixing plural chips, it is optional whether the chips are to be fixed directly or indirectly through other chips. The mixed signal type integrated circuit chip may be an MIS type semiconductor chip or may be a BiCMIS (Bipolar Complementary Metal Insulator Semiconductor) chip.

When the chip 1 is completed, as shown in FIG. 8, the chip 1 is subjected to die bonding for each unit device region 8 in the lead frame 12. Thereafter, bonding wires, using gold wires, are coupled between required portions by ball/wedge bonding, for example. Next, each sealing region (dotted line in FIG. 5) is sealed with resin by transfer molding to form a discrete sealing body 2 (a resin sealing process 101 in FIG. 11). More specifically, as shown in FIG. 12, the lead frame 12 after completion of wire bonding is set in such a manner that a principal portion of the unit device region 8 coincides with a mold cavity 53 formed between upper and lower dies 51 (in the figure a part of the lead frame 12 is made transparent to show the structure of a lower die 51*b*). Next, sealing resin 52 is conveyed through a runner 56 and is injected into the cavity 53 from a gate 57. At this time, the resin is filled also between leads beyond a boundary of the mold cavity 53 and then cures to form lead-to-lead resin projecting portions 54. Upon lapse of a pressuring period (sealing compression) after the fill, the lead-to-lead resin projecting portions 54 are fully compressed and hence they are strong structures. In this point they are different in properties from resin burrs (so-called flash burrs) which result from curing of the resin without undergoing the sealing compression after leaking from slight gaps between the leads and the molding die 51.

The sealing resin 52 is, for example, a halogen-free resin as a whole containing a low molecular weight epoxy resin as a principal resin component and approximately 80 wt % of a silica filler (a halogen-based flame retardant may be added in a field causing no environmental problem).

In this case, the section A-A' (FIG. 12) is like FIG. 13. As shown in FIG. 13, the die pad 3, chip 1, inner end portions of the leads 4 and bonding wires 6 are sealed with the sealing resin 52 within the mold cavity 53 formed between an upper die 51*a* and the lower die 51*b*, to form a resin sealing body 2.

Next, a look at the section B-B' (FIG. 12) shows that it is like FIG. 14. In this section, as shown in FIG. 14, a cavity-like space (sub-cavity) is formed by an inner side face of the tie bar 11 and the upper and lower dies 51*a*, 51*b* and a sufficient resin pressure acts thereon. Consequently, lead-to-lead resin projecting portions 54 are formed in the sub-cavity portion.

Next, a look at the section C-C' (FIG. 12) shows that, as illustrated in FIG. 15, a half-etched suspending lead 9 extends between a lead frame gate portion 25 and the die pad 3. On the left side of the suspending lead 9 is formed a gate break aperture 17. On the other hand, on the right side there are provided opposite-side leads 4, a tie bar 11, and a linear aperture row for division between the tie bar 11 and the lead frame body.

The lead frame 12 taken out from the molding die 51 is subjected to a gate/runner break processing (separating unnecessary resin in the gate and runner portions from the sealing body 2 and the lead frame 12). Thereafter, the resin of the resin sealing body 2 is cured at 102 (FIG. 11).

At this time, a side face 2*d* and the vicinity thereof of the sealing body 2 in each unit device region 8 of the lead frame 12 are in such a state as shown in FIG. 16. Resin burrs 34 of the sealing resin 52 leaking from a gap of the molding die 51 are formed thin on the leads 4 (thinner than the lead-to-lead resin projecting portions 54).

Now, as shown in FIG. 17, laser light 61 is radiated to the lead-to-lead resin projecting portions 54 of the lead frame by means of a laser light irradiator 62 to remove the lead-to-lead resin projecting portions 54 (a laser resin removing step 103 in FIG. 11). At this time, as shown in FIG. 18 (section D-D' in FIG. 16), the same laser light 61 may be radiated also to the resin burrs 34 on the leads 4 to remove the resin burrs 34 almost simultaneously (this acts to enhance the effect of the electrolysis and water jet to be described later). The laser used is, for example, a YAG laser (e.g., Nd:YAG) and the laser light 61 is, for example, near infrared light having a fundamental wavelength of 1064 nm, which is used for removing resin thermally. Even if near infrared light is applied to the package body in a somewhat offset manner, there will occur no great damage to the package body, but conversely it has the effect of relieving the strain of the package if the amount thereof is small. The laser output is, for example, about 40 W, corresponding to a pulse operation of 20 kHz or so. Adjustment is made so that the light is focused on the resin surface to be removed. The laser line width and the laser spacing is, for example, 40 micrometers or so and the scanning speed is, for example, 300 mm/sec or so. The number of times of irradiation is, for example, three times (three rounds around the sealing body 2). The reason for using near infrared light is that the sealing resin is a composition of many substances and that it exhibits a selectivity-free thermal action, which is efficient in removing the to-be-removed object as a whole. It is presumed that the lead-to-lead resin projecting portions 54 become resin burrs as a result of radiation of the laser light and that the resin burrs can be removed efficiently by subsequent means effective for removing resin burrs such as electrolysis or water jet.

As the laser light 61, there may also be used laser light having a wavelength of 532 nm in the visible light region or 355 nm in the ultraviolet region. In the case of a carbon dioxide gas laser, it is possible to utilize a wavelength of 10.6 micrometers (intermediate infrared region). The intermediate infrared region is disadvantageous in point of energy and it is necessary to take power and treatment time into account. The visible region or ultraviolet region costs high in point of power because of a higher harmonic. Besides, since the light itself is high in energy, the resin is removed to a satisfactory extent, but there is the possibility that the package itself may be damaged. Therefore, it is important to manage the irradiation position accuracy.

When the laser resin removing step 103 is completed, the side face 2d and the vicinity thereof of the sealing body in each unit device region of the lead frame 12 are in such a state as shown in FIG. 19. It is possible that a small amount of residual resin 54a (unremoved lead-to-lead resin projecting portions 54) may be present on the side faces of the leads 4. On the other hand, there sometimes is a case where the resin burrs 34 are not removed to a perfect extent although they are thin. At this stage, a shift may be made to a solder plating step 106 (FIG. 11) through hydraulic deburring or simple water washing or the like (including chemical washing).

However, for ensuring a still higher packaging reliability, it is preferable to perform an electrolytic deburring treatment 104 (FIG. 11). In the electrolytic deburring treatment 104, as shown in FIG. 20 (D-D' section in FIG. 19), electrolysis of water is conducted in an electrolytic aqueous solution of soda ash (mainly anhydrous sodium carbonate), with the lead frame 12 as a cathode (for example, under the conditions of a solution temperature of 50° C. or so, a treatment time of 15 minutes or so, and a current density of 10 A/dm2 or so). That is, hydrogen gas bubbles 63 are produced between the leads 4 and the residual resin 54a or the resin burrs 34 (together designated residual resin pieces), and with the power of the bubbles, the residual resin pieces can be lifted off, as shown in FIG. 21. At this stage, a shift may be made to the solder plating step 106 (FIG. 11) through simple water washing or the like (including chemical washing).

However, to ensure a still higher packaging reliability, it is preferable to conduct a hydraulic deburring treatment 105 (FIG. 11). In the hydraulic deburring treatment, as shown in FIG. 22, the residual resin pieces are finally removed by feeding liquid jets 65 of high-pressure washing water or liquid from nozzles 64 (there may be performed a liquid honing treatment involving adding grains into washing water or liquid or chemical treatment or blasting may be performed instead of or in combination with the hydraulic deburring treatment).

As a result of the above processings the side faces 2d and the vicinity thereof of the sealing body 2 in each unit device region 8 of the lead frame 12 are in such a clean state as shown in FIG. 23. For example, as shown in FIG. 11, the solder plating 106 (surface treatment for improving the packaging performance) is carried out by electroplating in an acidic tin (bismuth) plating solution (an alkaline plating solution may be used, but an acidic plating solution is advantageous in point of being high purity plating). Non-electrolytic plating or solder dipping will do as well, but electroplating is most suitable from the standpoint of economy and reliability. A tin-based lead-free solder comprising, for example, 2% bismuth and the balance tin (melting at 217° C.) is suitable as the material of the solder layer 41 (a lead-based solder is also employable if it causes no environmental problem). As examples of other lead-free solders there are mentioned tin-silver solder, tin-bismuth-silver-copper solder, and tin-bismuth-silver-antimony solder.

Next, as shown in FIGS. 24 and 25, the lead frame 12 having a front surface 12a and a rear surface 12b is cut from below by the punching die 21 (FIG. 4) along the cutting surface 21 corresponding to the external end portions 4d of the leads 4 (L in FIG. 24 is, for example, 0.3 mm or so and M is, for example, 0.5 mm or so) to separate the sealing body 2 and the tie bar 11 from each other (a dam & tie bar cutting step 108 in FIG. 11). Subsequently, the remaining connections are cut off by the punching die 22 (FIG. 4), thereby separating the sealing body 2 (device) from the lead frame body 12 (a separating step 109 in FIG. 11). The dam & tie bar cutting step 108 and the separating step 109 configure a device isolation process.

As noted above, by cutting the external end portions 4d of the leads 4 from below with use of the punching die 21, the solder layer on the lower surface 4b of each lead 4 moves to the lead tip face and forms a lead tip solder region 41c (physically the lower surface itself flows and becomes a lower half of the lead tip face), as shown in FIG. 26. Thus, the solder layers (solder regions) 41 (41a, 41b, 41c) are formed on the upper and lower surfaces, both side faces and tip face of each lead 4, so when reflow-soldering lands 46 on a wiring substrate 45, a solder fillet 42 is formed in a normal manner, as shown in FIG. 27.

4. Summary

Although the present invention has been described above concretely on the basis of an embodiment thereof, it goes without saying that the present invention is not limited to the above embodiment, but that various changes may be made within the scope not departing from the gist of the invention.

For example, although a QFN type plastic package was described concretely in the above embodiment, it goes without saying that the present invention is not limited thereto, but is widely applicable also to other types of plastic packages having projecting resin portions between leads. Although a description was given in the above embodiment mainly about the case where transfer molding was applied, it goes without saying that the present invention is not limited thereto, but is applicable also to other plastic molding methods, e.g., compression molding.

What is claimed is:

1. A semiconductor device comprising:
a semiconductor chip having an obverse surface on which a plurality of electrodes are disposed;
a chip mounting portion having an obverse surface on which the semiconductor chip is disposed;
a suspension lead having an obverse surface, a reverse surface opposite the obverse surface, and side surfaces between the obverse and reverse surfaces in the thickness direction of the suspension lead, the suspension lead supporting the chip mounting portion;
a plurality of leads having an obverse surface, a reverse surface opposite the obverse surface, and side surfaces between the obverse and reverse surfaces in a thickness direction of each of the plurality of leads, respectively, the plurality of leads being disposed around the chip mounting portion;
a plurality of wires connecting the plurality of electrodes of the semiconductor chip and the plurality of leads, respectively; and
a sealing body having a top surface, a bottom surface opposite the top surface, and a plurality of side surfaces between the top and bottom surfaces in a thickness direction of the sealing body, the sealing body sealing the semiconductor chip, a part of the suspension lead, and a part of each of the plurality of leads,
wherein the suspension lead and the plurality of the leads are respectively disposed along the plurality of the side surfaces of the sealing body such that the suspension lead and each of the plurality of the leads respectively overlaps with the plurality of the side surfaces of the sealing body in a plan view,
wherein, in the plan view, each of the plurality of leads has a first part positioned outside of one of the plurality of the side surfaces of the sealing body and a second part positioned inside of one of the plurality of the side surfaces of the sealing body,
wherein, in the plan view, the suspension lead has a first part positioned outside of one of the plurality of the side surfaces of the sealing body and a second part positioned inside of one of the plurality of the side surfaces of the sealing body,
wherein the obverse surface, the reverse surface, and the plurality of the side surfaces of the first part of the suspension lead are exposed from the sealing body,
wherein the obverse surface, the reverse surface, and the plurality of the side surfaces of the first part of each of the plurality of leads are exposed from the sealing body,
wherein the obverse surface and the plurality of the side surfaces of the second part of the suspension lead are covered by the sealing body, and the reverse surface of the second part of the suspension lead is exposed from the bottom surface of the sealing body,
wherein the obverse surface and the plurality of the side surfaces of the second part of each of the plurality of leads are covered by the sealing body, and the reverse surface of the second part of each of the plurality of leads is exposed from the bottom surface of the sealing body, and
wherein an area of the obverse surface of the first part of the suspension lead is larger than an area of the obverse surface of the first part of each of the plurality of leads in a plan view.

2. The semiconductor device according to claim 1, wherein a side surface of the sealing body where the first part of the suspension lead projects is a chamfered surface located at a corner of the sealing body in a plan view.

3. The semiconductor device according to claim 1, wherein the suspension lead has a third part between the first part and the chip mounting portion in an extending direction of the suspension lead, and
wherein the third part of the suspension lead is sealed by the sealing body.

4. The semiconductor device according to claim 1, wherein a reverse surface opposite the obverse surface of the chip mounting portion is exposed from the bottom surface of the sealing body.

5. The semiconductor device according to claim 3, wherein the second part of the suspension lead is positioned between the first and third parts in the extending direction of the suspension lead.

6. The semiconductor device according to claim 1, wherein a width of the first part of the suspension lead is wider than a width of the second part of the suspension lead in a direction perpendicular to the extending direction of the suspension lead.

7. The semiconductor device according to claim 6, wherein a widest portion of the first part of the suspension lead corresponds to an end portion of the suspension lead.

8. The semiconductor device according to claim 1, wherein a width of the first part of the suspension lead in a direction perpendicular to the extending direction of the suspension lead is wider than a width of the first part of each of the plurality of leads in a direction perpendicular to the extending direction of each of the plurality of leads.

9. The semiconductor device according to claim 1, wherein a thickness of the chip mounting portion and a thickness of each of the plurality of the leads are same in a thickness direction of the sealing body.

10. The semiconductor device according to claim 4, wherein the bottom surface of the chip mounting portion, the reverse surface of each of the plurality of the leads, and the reverse surface of each of the first and second parts of the suspension lead are in a same plane.

11. The semiconductor device according to claim 1, wherein a solder plating is disposed on the obverse surfaces, the reverse surfaces, and parts of the plurality of the side surfaces of the first parts of the suspension lead and the plurality of leads.

12. The semiconductor device according to claim 11, wherein the parts on which the solder plating is disposed on the plurality of the side surfaces of the first parts of the suspension lead and the plurality of leads are portions on which a solder filet can be disposed.

13. The semiconductor device according to claim 1, wherein a bus bar is disposed between the chip mounting portion and parts of the plurality of leads in the plan view, and integrated with the suspension lead.

14. The semiconductor device according to claim 13, wherein the bus bar is covered by the sealing body.

15. The semiconductor device according to claim 1, wherein each of the first parts of the suspension lead and the plurality of leads is projected from each of the side surfaces of the sealing body.

16. A semiconductor device comprising:
a semiconductor chip having an obverse surface on which a plurality of electrodes are disposed;
a chip mounting portion having an obverse surface on which the semiconductor chip is disposed;
a suspension lead having an obverse surface and a reverse surface opposite the obverse surface, the suspension lead supporting the chip mounting portion;
a plurality of leads having an obverse surface and a reverse surface opposite the obverse surface respectively, the plurality of leads being disposed around the chip mounting portion;
a plurality of wires connecting the plurality of electrodes of the semiconductor chip and the plurality of leads, respectively; and
a sealing body having a top surface and a bottom surface opposite the top surface, the sealing body sealing the semiconductor chip, a part of the suspension lead, and a part of each of the plurality of leads,
wherein the suspension lead and the plurality of the leads are respectively disposed along an outer edge of the sealing body such that the suspension lead and each of the plurality of the leads overlaps with the outer edge of the sealing body in a plan view, and
wherein an area of the reverse surface exposed from the sealing body of the suspension lead is larger than an area of the reverse surface exposed from the sealing body of each of the plurality of leads.

17. The semiconductor device according to claim 16,
wherein an area of a part positioned outside of the outer edge of the sealing body of the suspension lead is larger than an area of a part positioned outside of the outer edge of the sealing body of each of the plurality of leads.

18. A semiconductor device comprising:
a semiconductor chip having an obverse surface on which a plurality of electrodes are disposed;
a chip mounting portion having an obverse surface on which the semiconductor chip is disposed and a reverse surface opposite the obverse surface;
a suspension lead having an obverse surface, a reverse surface opposite the obverse surface, and side surfaces between the obverse and reverse surfaces in a thickness direction of the suspension lead, the suspension lead supporting the chip mounting portion;
a plurality of leads having an obverse surface, a reverse surface opposite the obverse surface, and side surfaces between the obverse and reverse surfaces in a thickness direction of each of the plurality of leads respectively, the plurality of leads being disposed around the chip mounting portion;
a plurality of wires connecting the plurality of electrodes of the semiconductor chip and the plurality of leads, respectively;
a sealing body having a top surface, a bottom surface opposite the top surface, and a plurality of side surfaces between the top and bottom surfaces in a thickness direction of the sealing body, the sealing body sealing the semiconductor chip, a part of the suspension lead, and a part of each of the plurality of leads,
wherein the suspension lead and the plurality of the leads are respectively disposed along the plurality of the side surfaces of the sealing body such that the suspension lead and each of the plurality of the leads respectively overlaps with the plurality of the side surfaces of the sealing body in a plan view,
wherein, in the plan view, each of the plurality of leads has a first part positioned outside of each of the plurality of the side surfaces of the sealing body and a second part positioned inside of each of the plurality of the side surfaces of the sealing body,
wherein, in the plan view, the suspension lead has a first part positioned outside of one of the plurality of the side surfaces of the sealing body, a second part positioned inside of one of the plurality of the side surfaces of the sealing body, and third part positioned inside of one of the plurality of the side surfaces of the sealing body,
wherein the obverse surface, the reverse surface, and the plurality of the side surfaces of the first part of the suspension lead are exposed from the sealing body,
wherein the obverse surface, the reverse surface, and the plurality of the side surfaces of the first part of each of the plurality of leads are exposed from the sealing body,
wherein the obverse surface and the plurality of the side surfaces of the second part of the suspension lead are covered by the sealing body, and the reverse surface of the second part of the suspension lead is exposed from the bottom surface of the sealing body,
wherein the obverse surface and the plurality of the side surfaces of the second part of each of the plurality of leads are covered by the sealing body, and the reverse surface of the second part of each of the plurality of leads is exposed from the bottom surface of the sealing body,
wherein the reverse surface of the chip mounting portion is exposed from the bottom surface of the sealing body,
wherein the third part of the suspension lead is positioned between the chip mounting portion and the second part of the suspension lead in an extending direction of the suspension lead, and the third part of the suspension lead is sealed by the sealing body, and
wherein an area of the obverse surface of the first part of the suspension lead is larger than an area of the obverse surface of the first part of each of the plurality of leads in the plan view.

19. The semiconductor device according to claim 18,
wherein a thickness of the third part of the suspension lead is thinner than a thickness of each of the first and second parts of the suspension lead in a thickness direction of the sealing body.

20. The semiconductor device according to claim 19,
wherein a bus bar is disposed between the chip mounting portion and parts of the plurality of leads in the plan view, and integrated with the suspension lead,
wherein the bus bar is covered by the sealing body, and
wherein a thickness of the bus bar is thinner than the thickness of each of the first and second parts of the suspension lead in the thickness direction of the sealing body.

* * * * *